United States Patent [19]
Sugiura et al.

[11] Patent Number: 5,905,292
[45] Date of Patent: May 18, 1999

[54] SEMICONDUCTOR DEVICE IN WHICH AN INCREASE IN THRESHOLD VOLTAGE, RESULTING FROM BACK-GATE BIAS EFFECT IS MITIGATED, AND METHOD OF MANUFACTURING THE SAME

[75] Inventors: Souichi Sugiura, Fishkill, N.Y.; Masaru Koyanagi, Yokohama, Japan

[73] Assignee: Kabushiki Kaisha Toshiba, Kanagawa-Ken, Japan

[21] Appl. No.: 09/129,836

[22] Filed: Aug. 6, 1998

Related U.S. Application Data

[63] Continuation of application No. 08/863,601, May 27, 1997, Pat. No. 5,841,175, which is a continuation of application No. 08/360,594, Dec. 21, 1994, abandoned.

[30] Foreign Application Priority Data

Dec. 27, 1993 [JP] Japan .................................... 5-347246
Dec. 16, 1994 [JP] Japan .................................... 6-313000

[51] Int. Cl.⁶ .................................................. H01L 29/78
[52] U.S. Cl. ........................... 257/402; 257/371; 257/392
[58] Field of Search ..................................... 257/392, 404, 257/403, 402, 391, 371; 438/217

[56] References Cited

U.S. PATENT DOCUMENTS

| | | | |
|---|---|---|---|
| 4,315,781 | 2/1982 | Henderson | 257/402 |
| 4,410,904 | 10/1983 | Wollesen | 257/391 |
| 4,472,871 | 9/1984 | Green et al. | 257/392 |
| 4,649,629 | 3/1987 | Miller et al. | 257/402 |
| 4,784,968 | 11/1988 | Komori et al. | 437/56 |
| 5,043,788 | 8/1991 | Omoto et al. | 257/371 |
| 5,075,242 | 12/1991 | Nakahara | 257/371 |
| 5,079,177 | 1/1992 | Lage et al. | 437/56 |
| 5,148,050 | 9/1992 | Koide | 307/271 |
| 5,210,437 | 5/1993 | Sawada et al. | 257/392 |
| 5,250,835 | 10/1993 | Izawa | 257/408 |
| 5,362,981 | 11/1994 | Sato et al. | 257/402 |
| 5,363,328 | 11/1994 | Browning, III et al. | 365/154 |
| 5,369,045 | 11/1994 | Ng et al. | 437/45 |
| 5,382,819 | 1/1995 | Honjo | 257/392 |
| 5,385,857 | 1/1995 | Solo de Zaldivar | 437/44 |
| 5,424,226 | 6/1995 | Vo et al. | 257/404 |
| 5,489,795 | 2/1996 | Yoshimura et al. | 257/371 |
| 5,789,778 | 8/1998 | Murai | 257/404 |

FOREIGN PATENT DOCUMENTS

| | | | |
|---|---|---|---|
| 0442413 | 8/1991 | European Pat. Off. | 257/392 |
| 4-3468 | of 0000 | Japan . | |
| 0165358 | 12/1981 | Japan | 257/402 |
| 0110665 | 5/1988 | Japan | 257/392 |
| 0357873 | 12/1992 | Japan | 257/392 |

*Primary Examiner*—David B. Hardy
*Attorney, Agent, or Firm*—Banner & Witcoff, Ltd.

[57] ABSTRACT

Disclosed herein is a semiconductor device comprising a semiconductor substrate, a well region provided in the surface of the substrate, a plurality of MOSFETs provided in the well region. The well region has parts having a low surface impurity concentration. Some of the MOSFETs have their channel regions provided in those parts of the well region which have the low surface impurity concentration. The other MOSFETs have their channel regions provided in other parts of the well region.

24 Claims, 33 Drawing Sheets

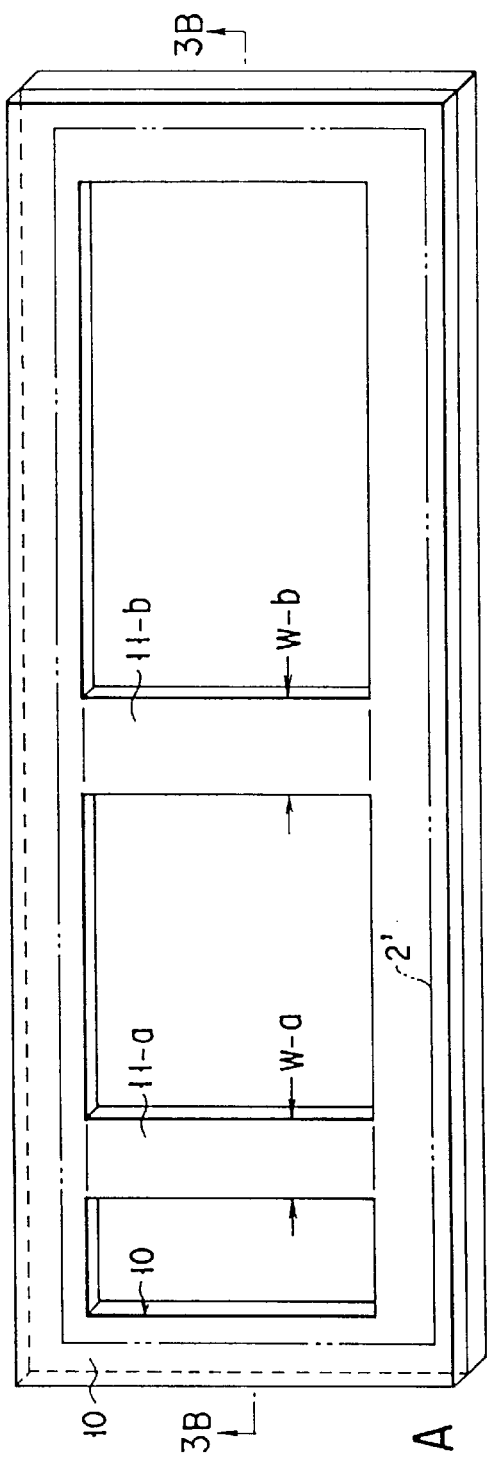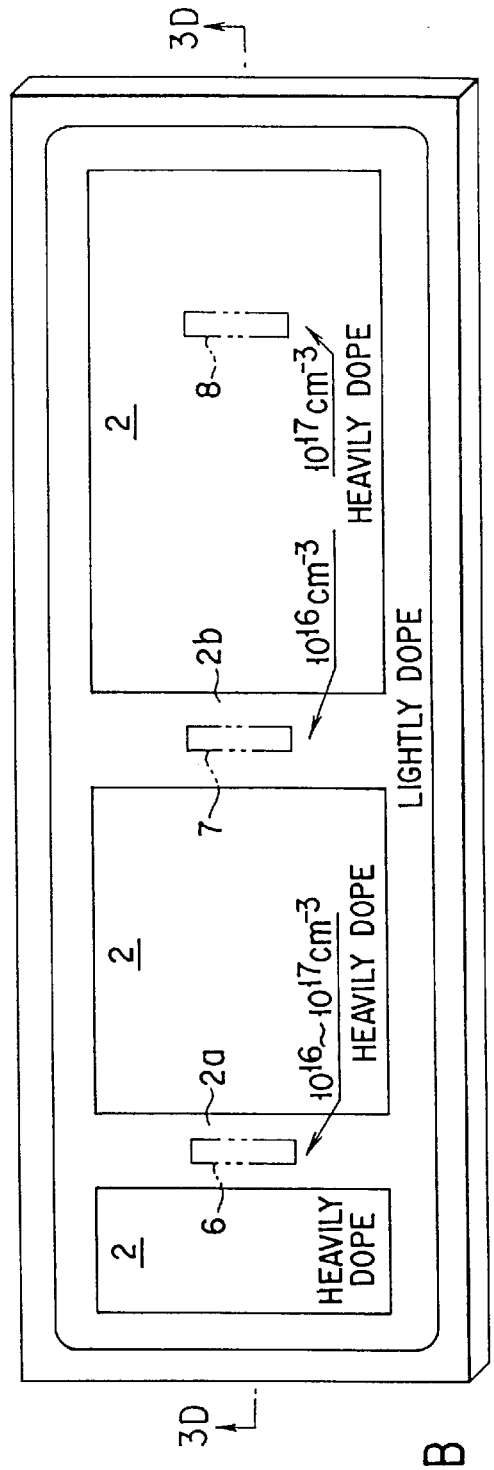
F I G. 4A
F I G. 4B

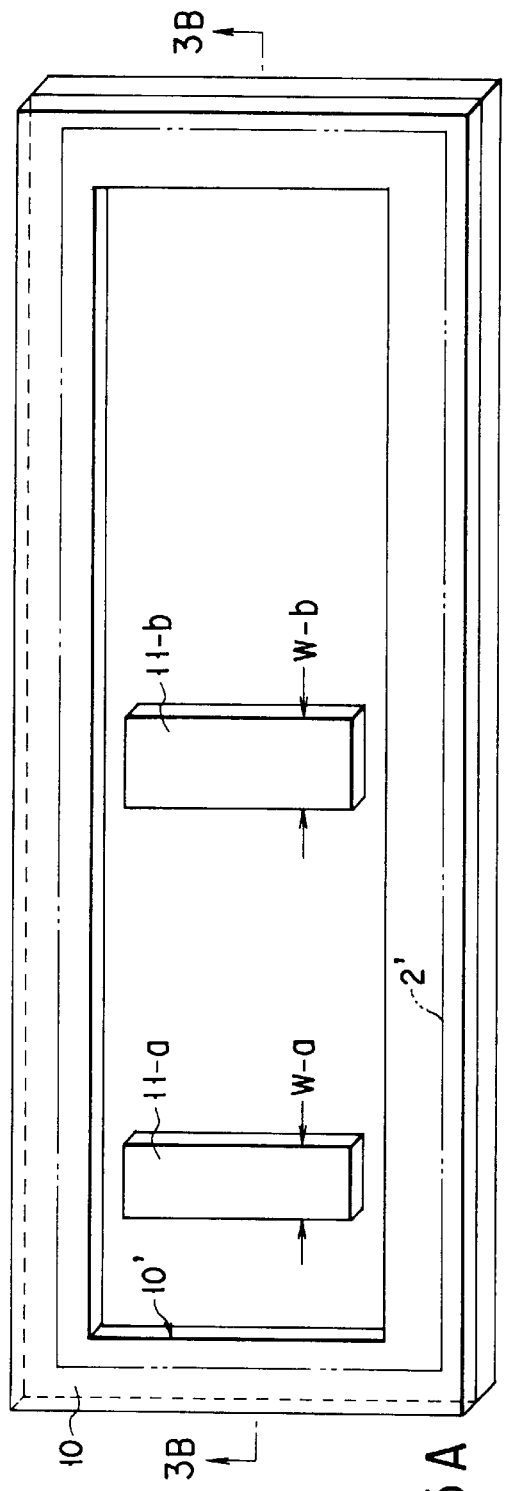
F I G. 5A
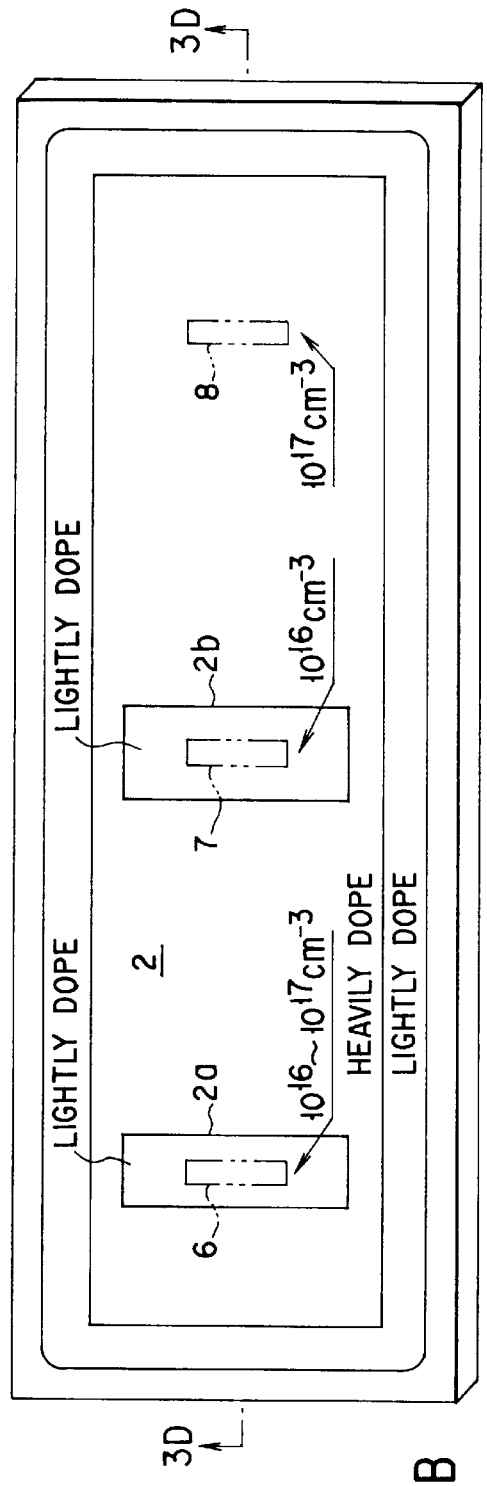
F I G. 5B

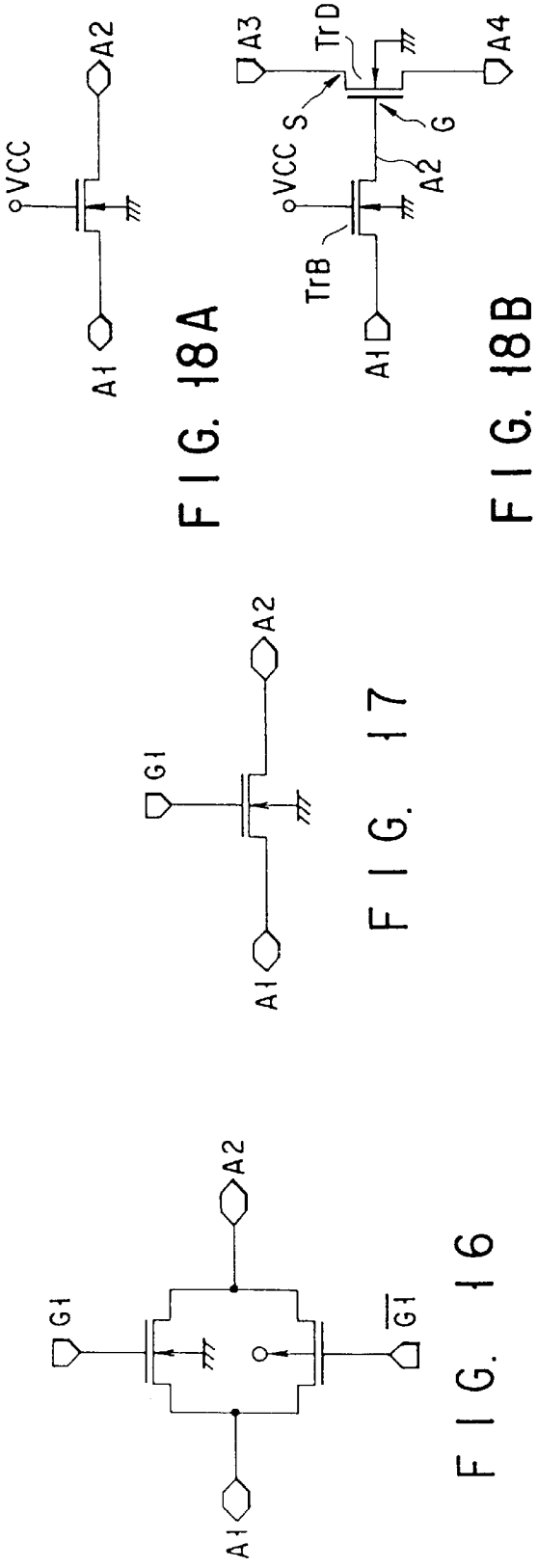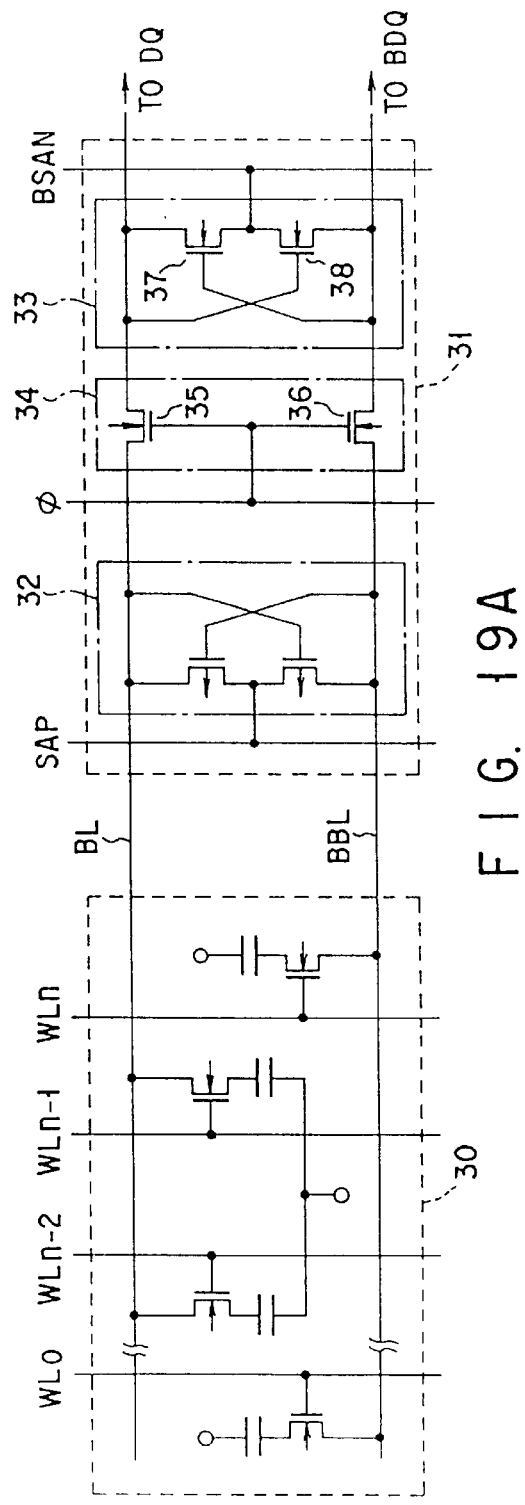

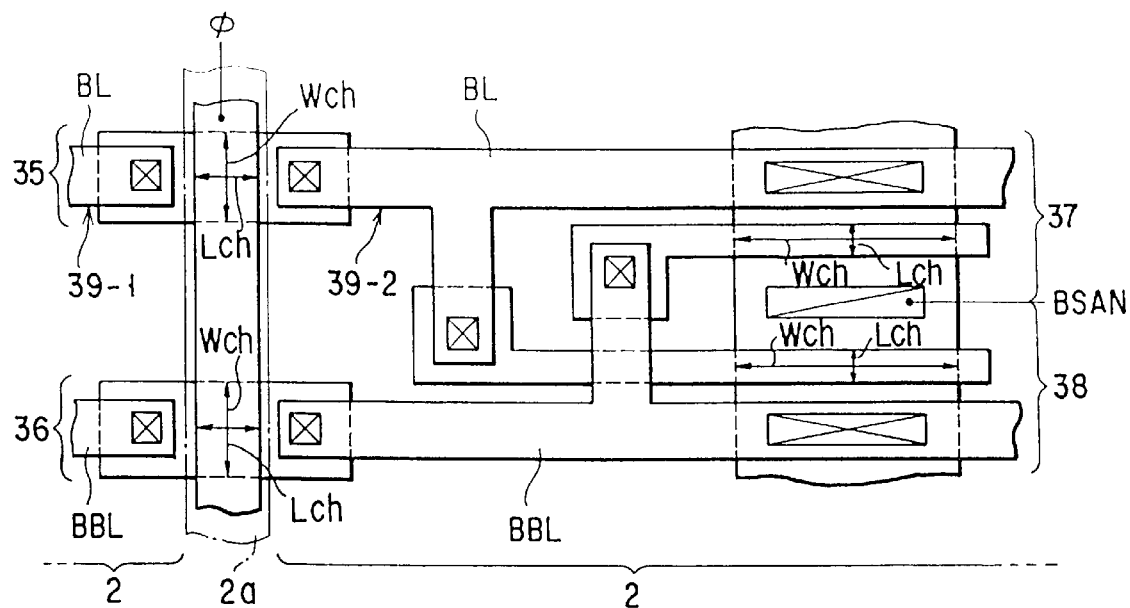
FIG. 19B
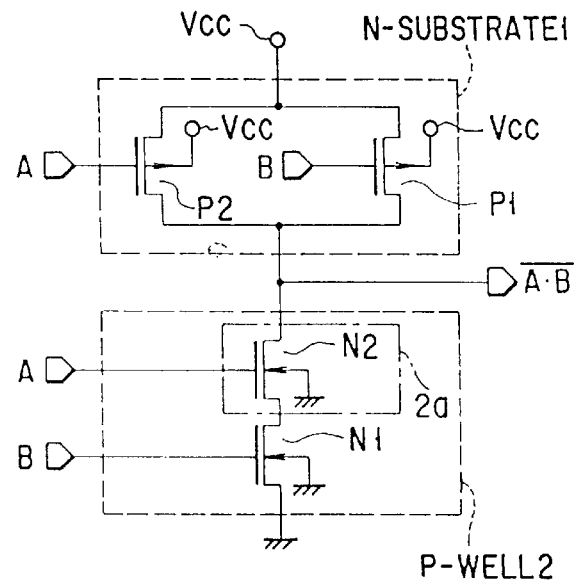
FIG. 20A
FIG. 20B
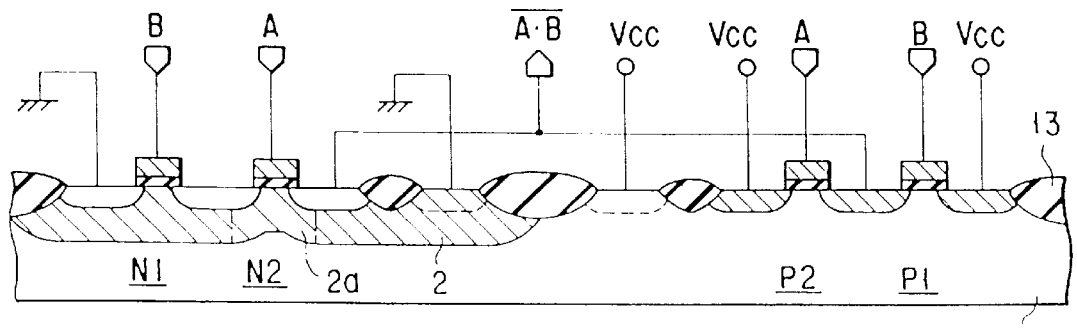
FIG. 20C

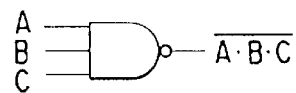
F I G. 2 1 A
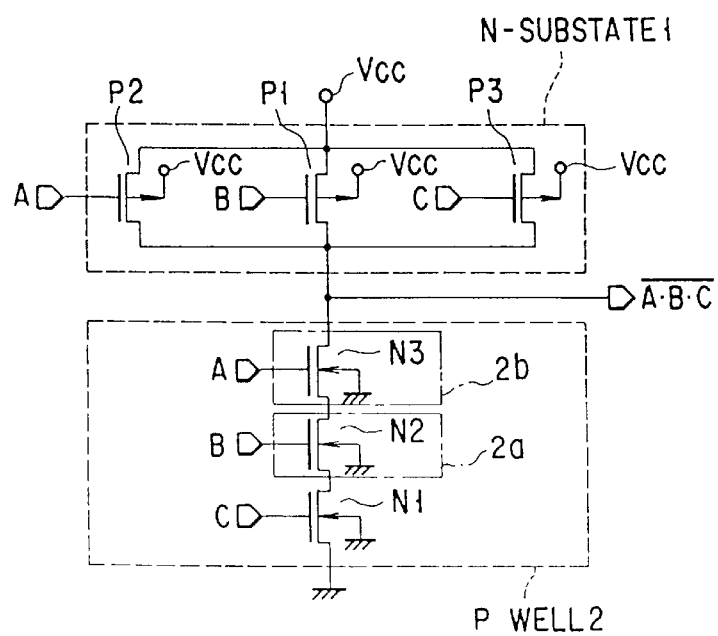
F I G. 2 1 B
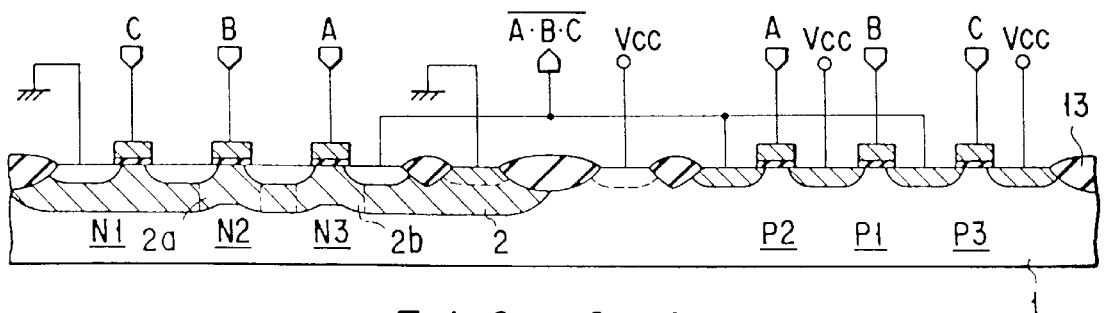
F I G. 2 1 C

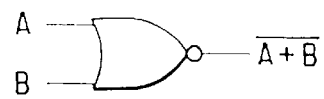
F I G. 22 A
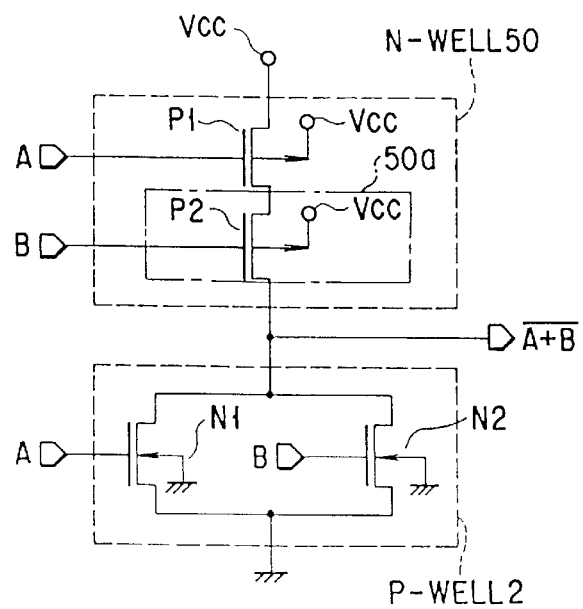
F I G. 22 B
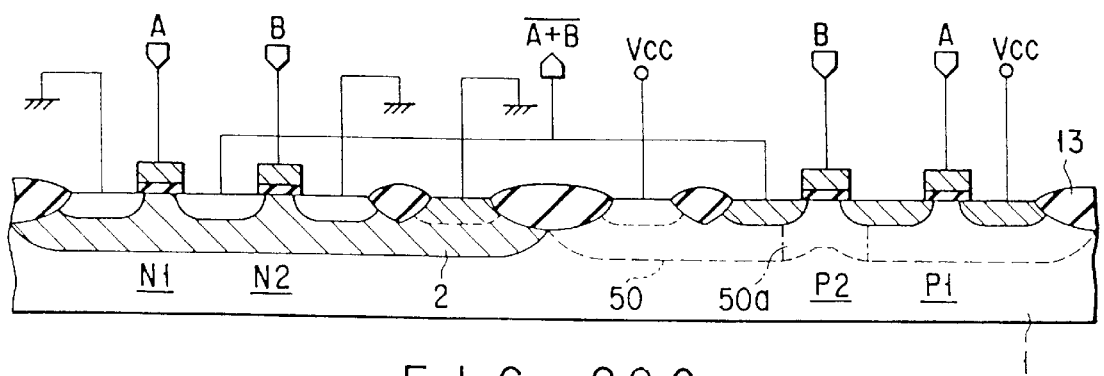
F I G. 22 C

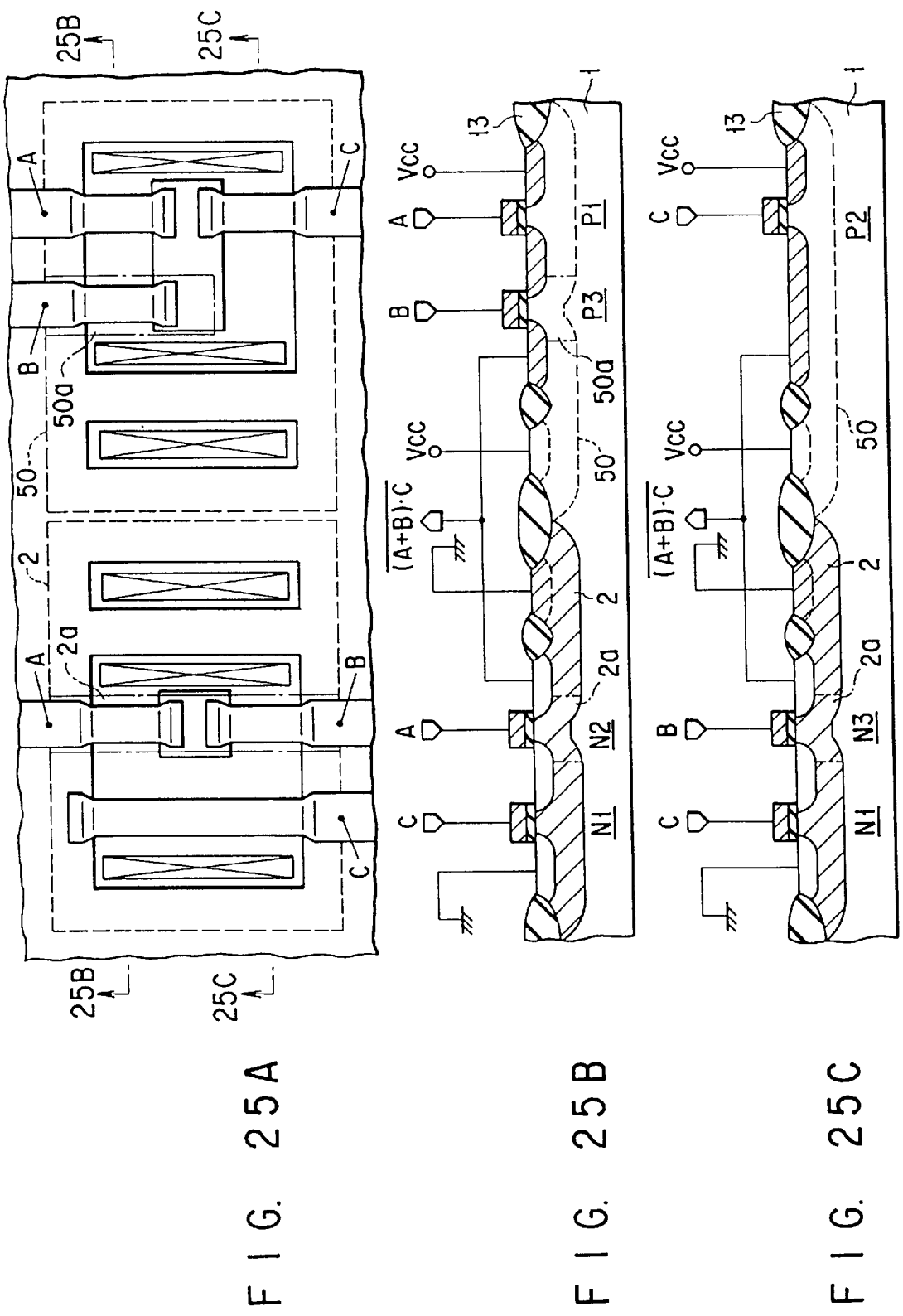

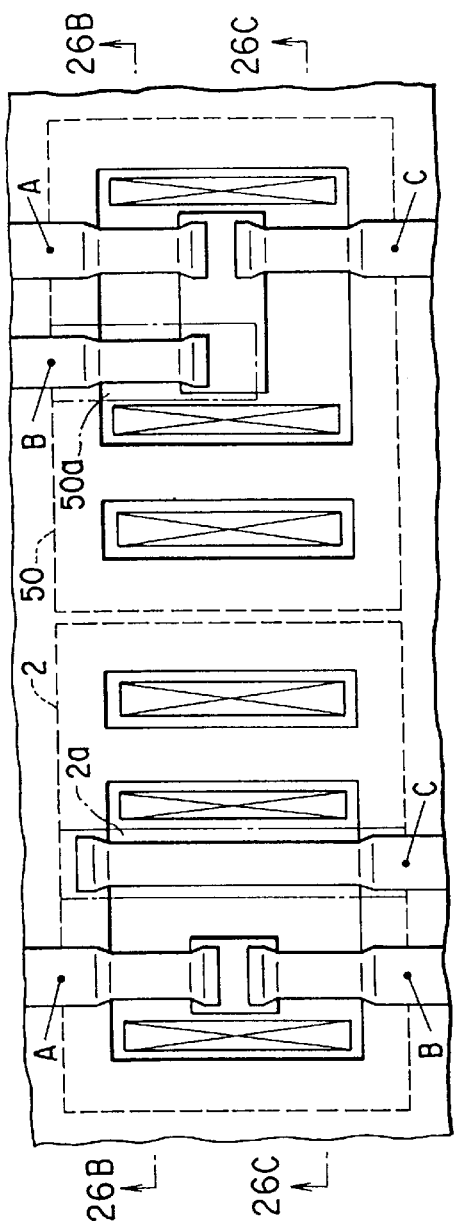
F I G. 26A
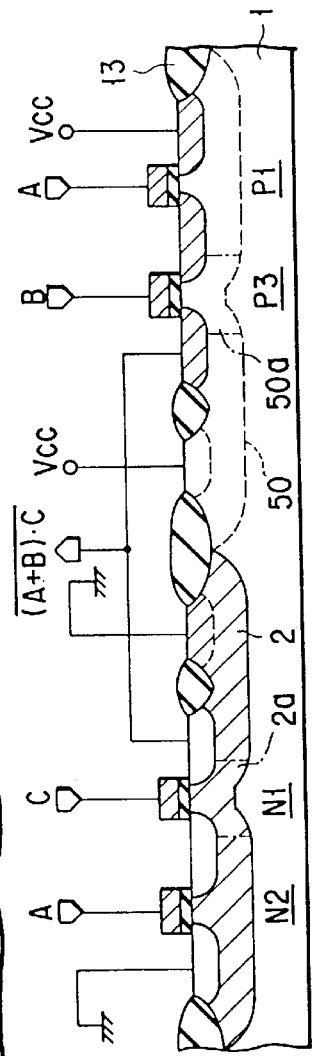
F I G. 26B
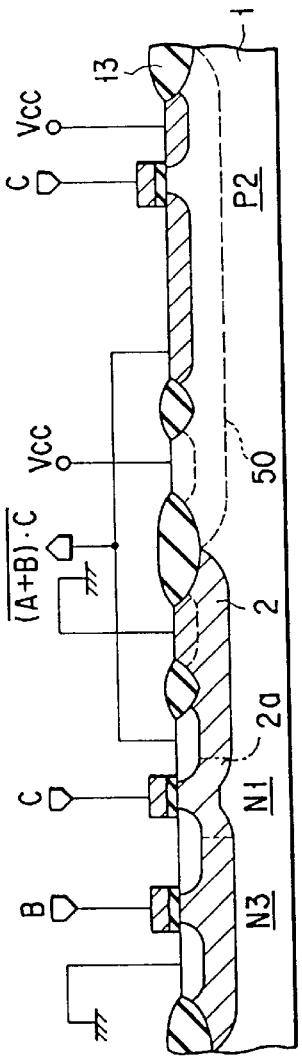
F I G. 26C

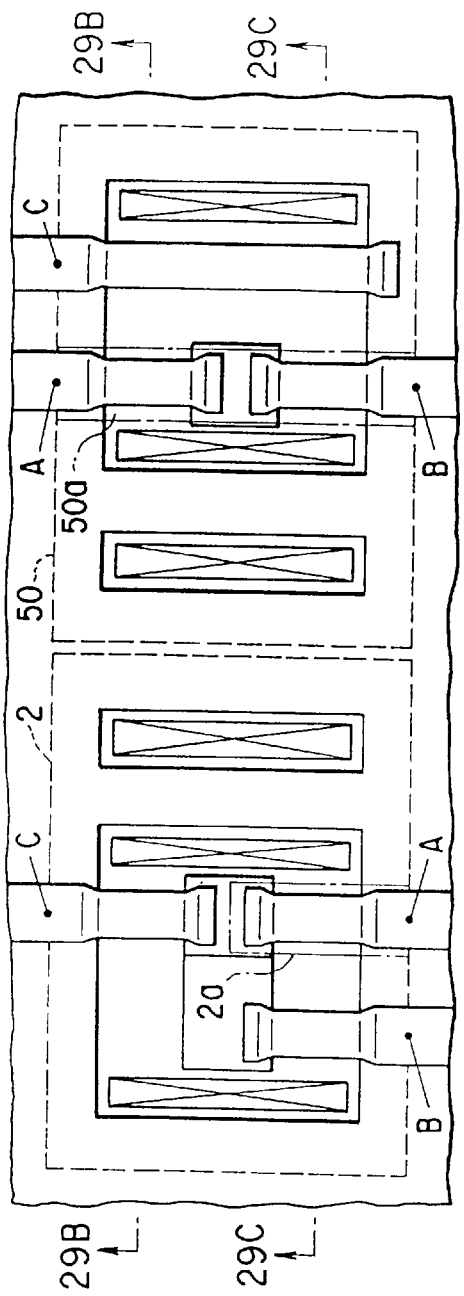
F I G. 29A
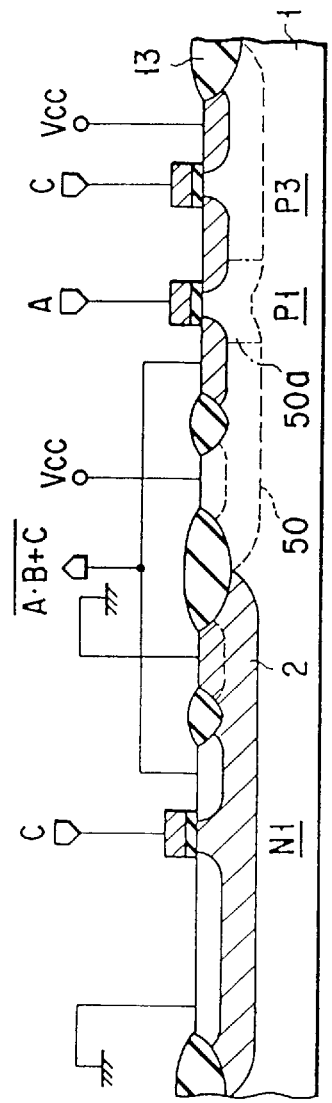
F I G. 29B
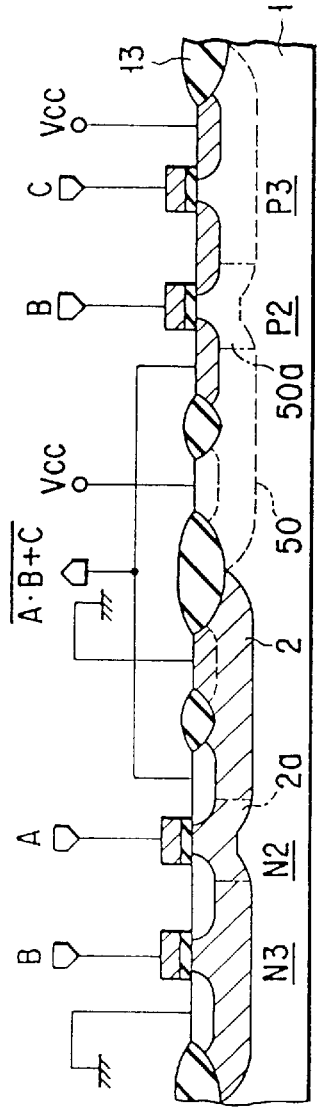
F I G. 29C

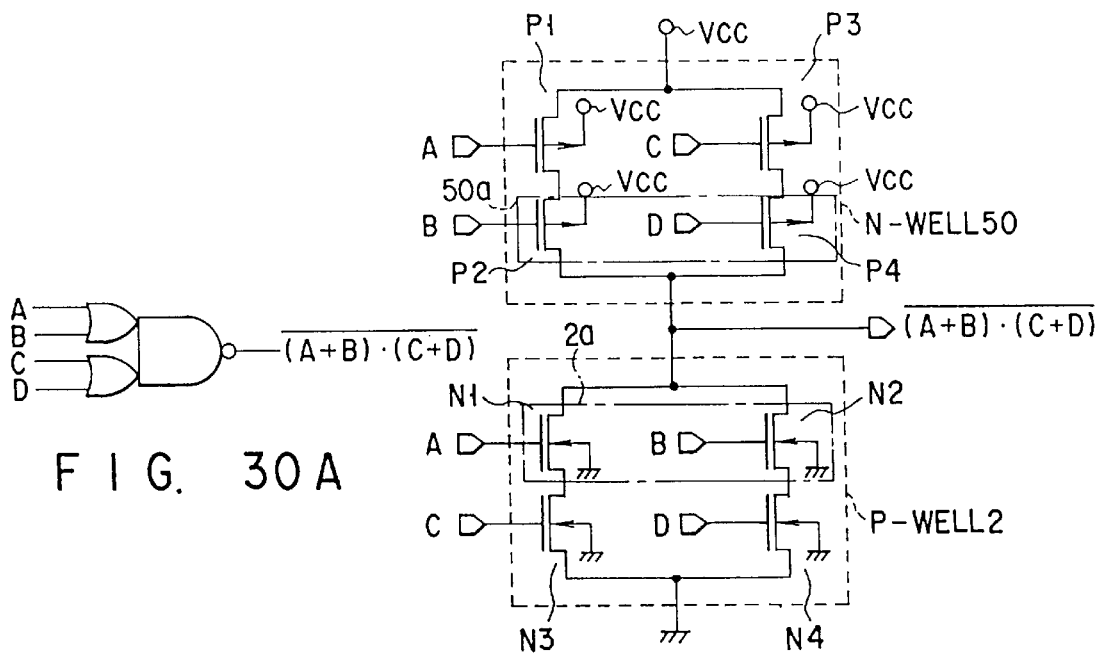
FIG. 30A
FIG. 30B
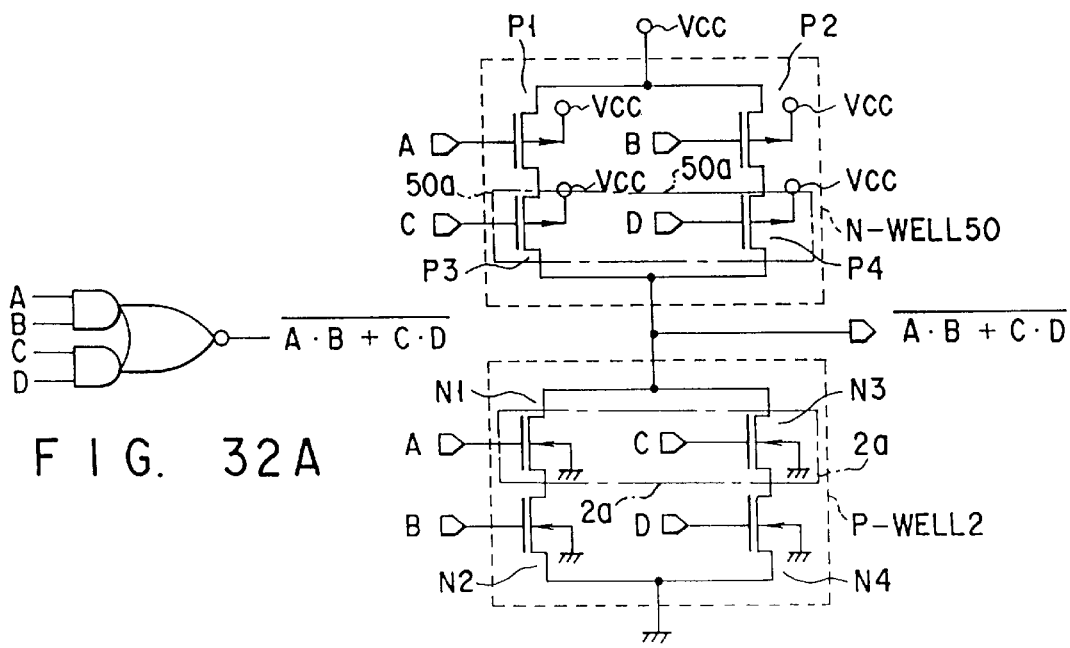
FIG. 32A
FIG. 32B

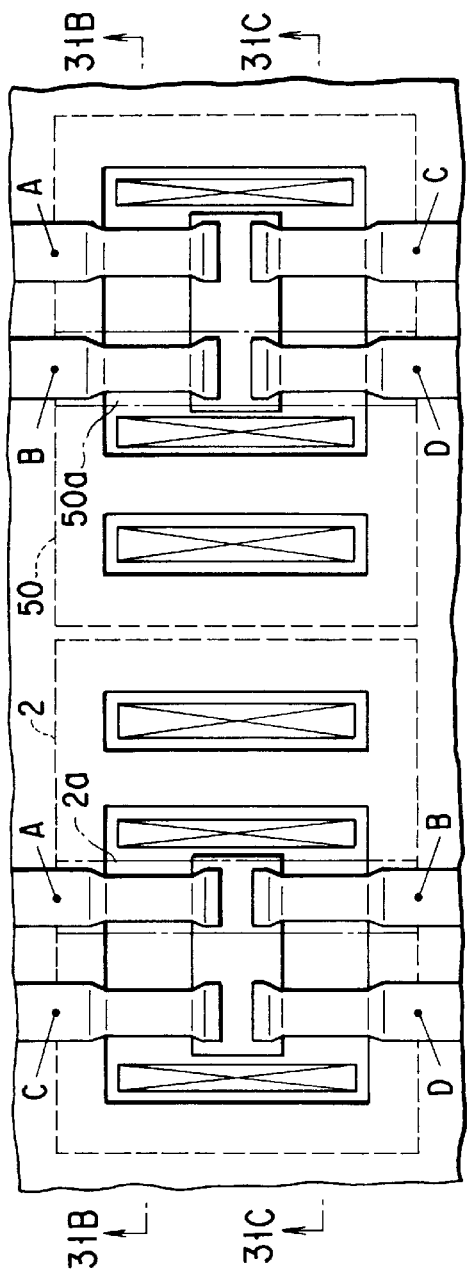
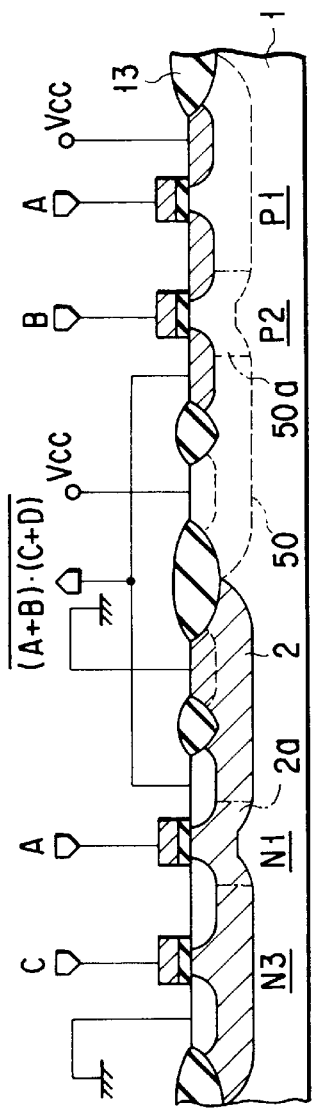
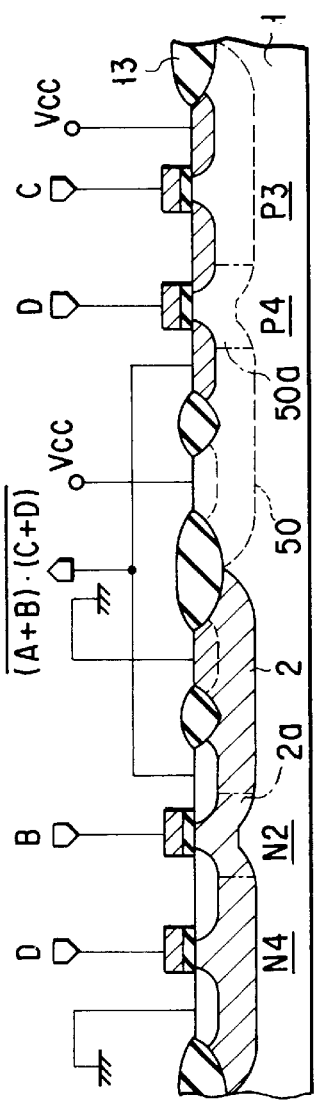
F I G. 31A
F I G. 31B
F I G. 31C

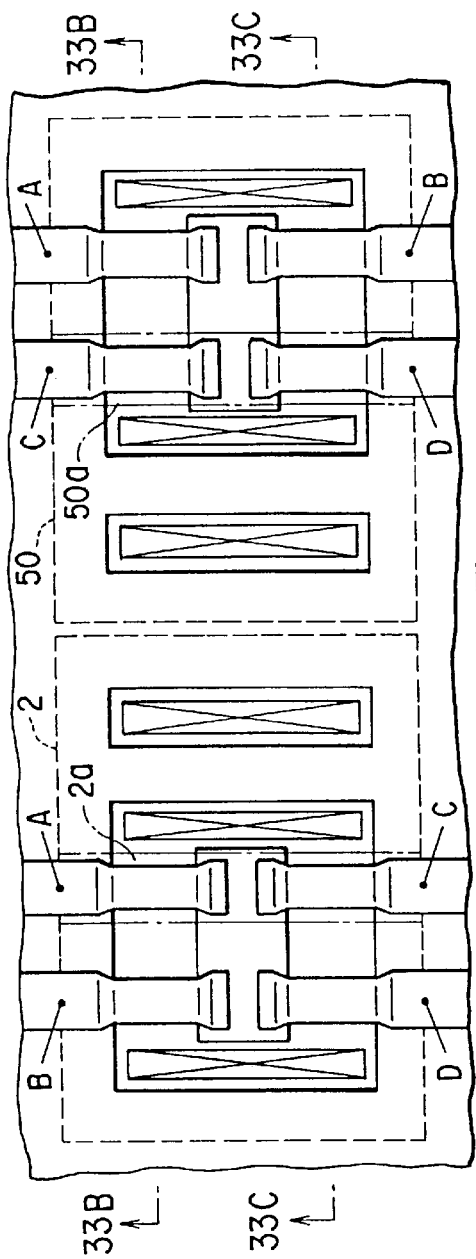
F I G. 33A
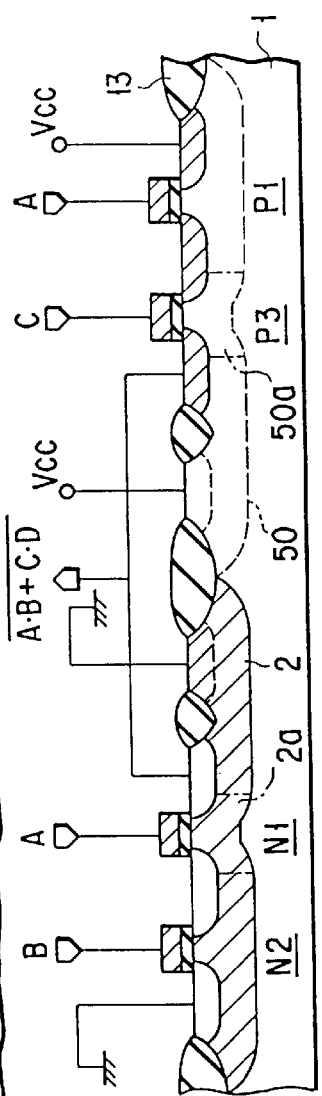
F I G. 33B
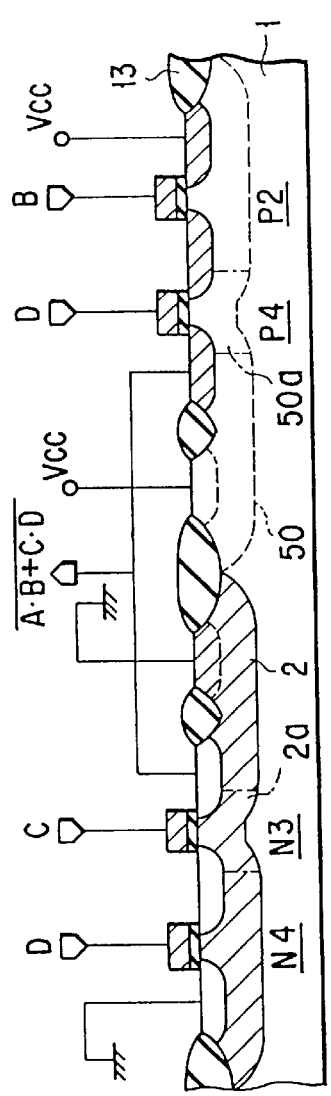
F I G. 33C

F I G. 34A 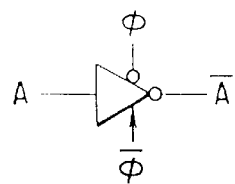
F I G. 34B    F I G. 34C
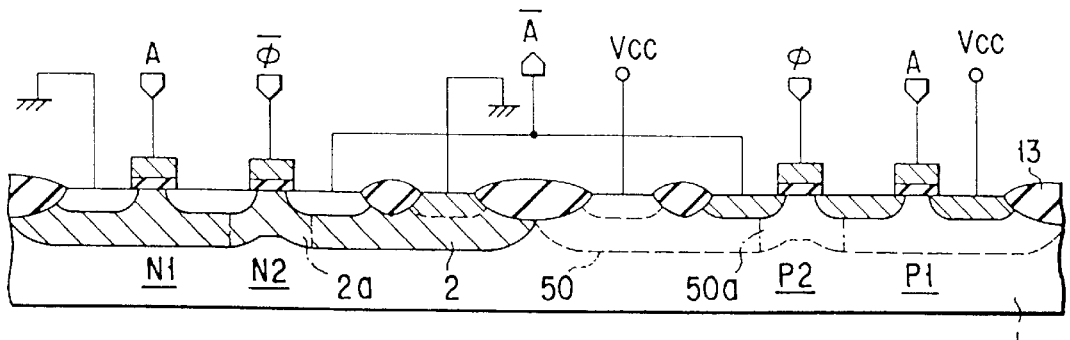
F I G. 35
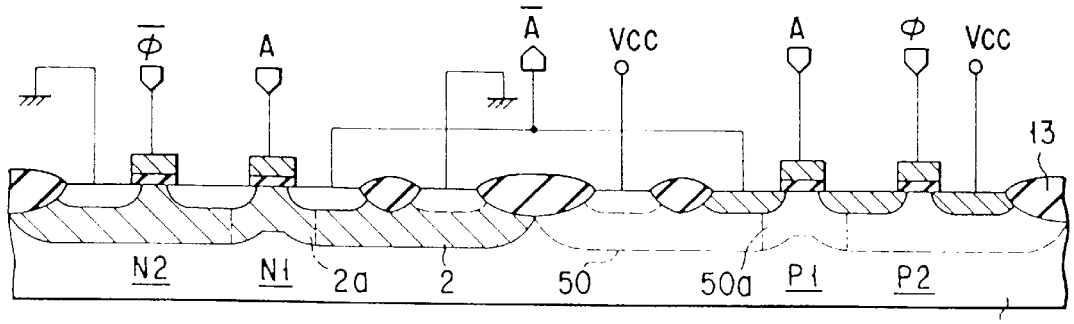
F I G. 36

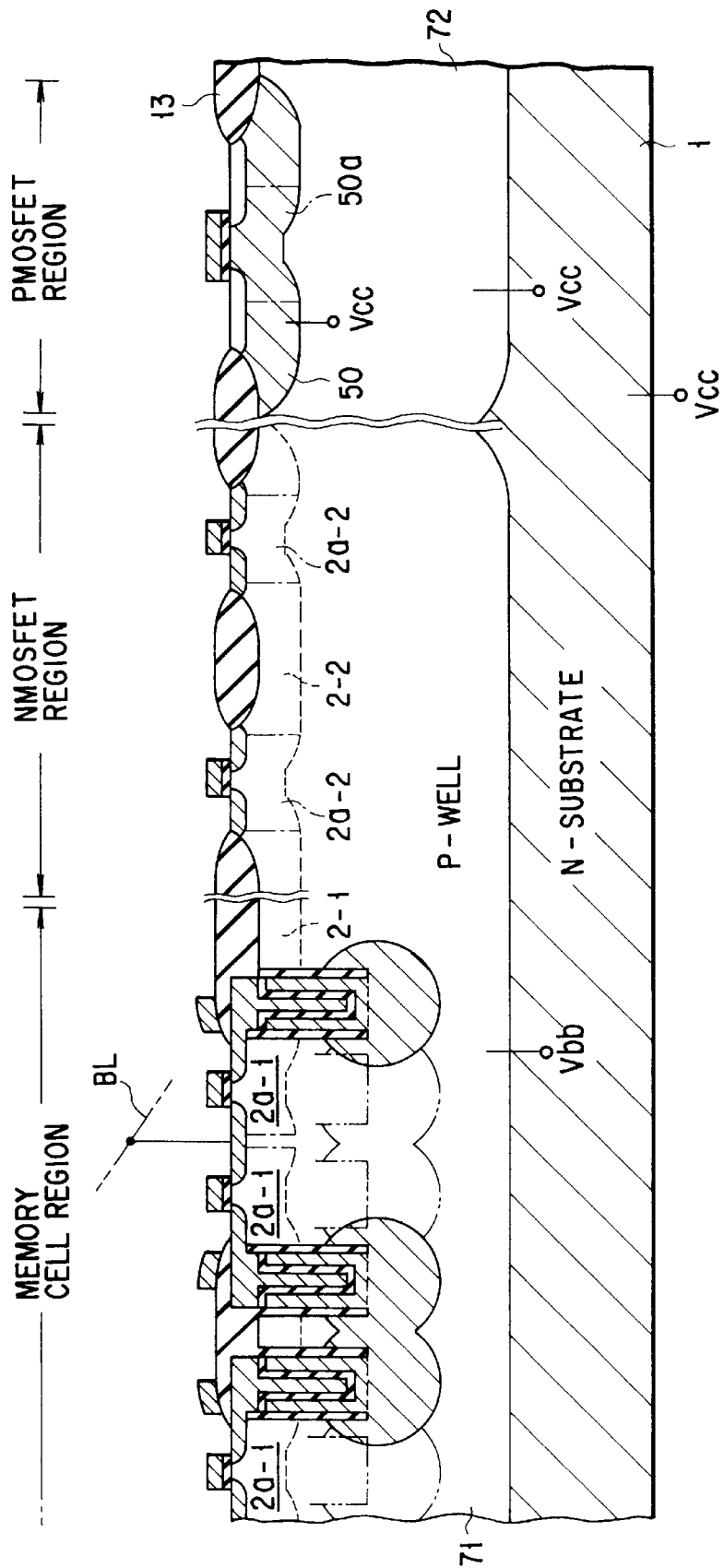
F I G. 40

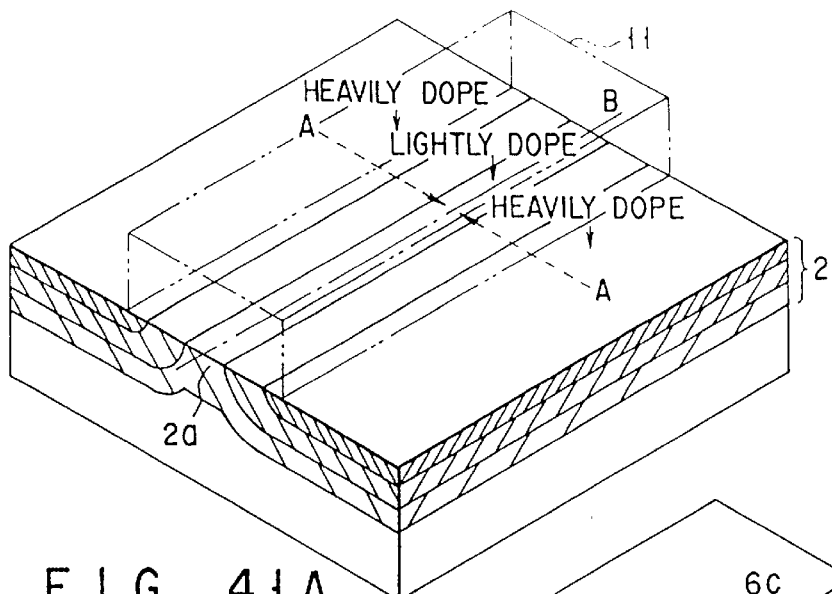
F I G. 41A
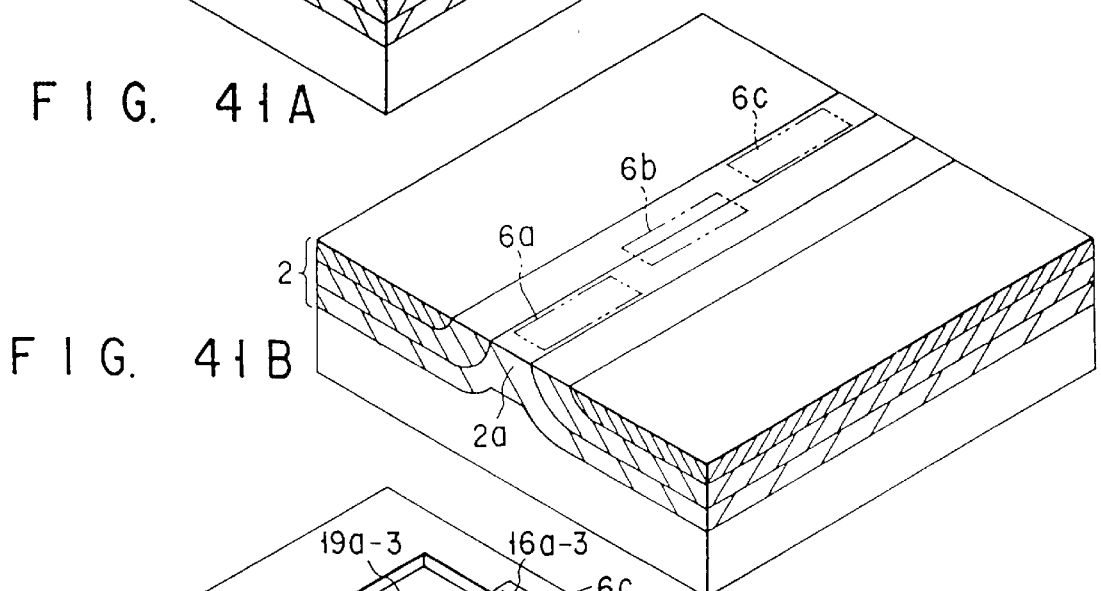
F I G. 41B
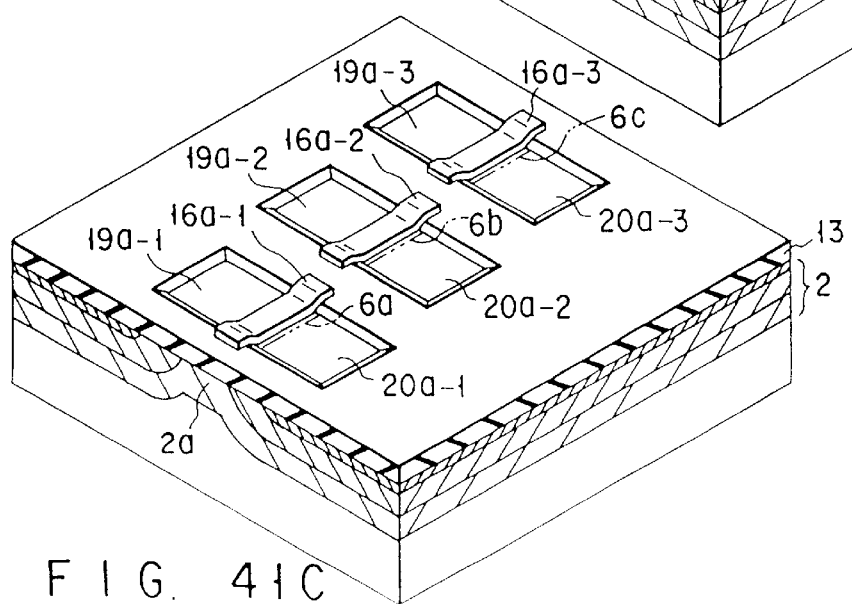
F I G. 41C

SEMICONDUCTOR DEVICE IN WHICH AN INCREASE IN THRESHOLD VOLTAGE, RESULTING FROM BACK-GATE BIAS EFFECT IS MITIGATED, AND METHOD OF MANUFACTURING THE SAME

This application is a Continuation of prior application Ser. No. 08/863,601, filed May 27, 1997 now U.S. Pat. No. 5,841,175, which is a continuation of prior application Ser. No. 08/360,594 filed Dec. 21, 1994, now abandoned.

BACKGROUND OF THE INVENTION

1. Field of the Invention

The present invention relates to a semiconductor device and a method of manufacturing the same, and more particularly to a semiconductor device having a plurality of elements provided in one well region and a method of manufacturing this semiconductor device.

2. Description of the Related Art

Well known as a semiconductor device having a well region is a CMOS device in which N-channel MOSFETs and P-channel MOSFETs (hereinafter referred to as "NMOSs" and "PMOSs") constitute a desired circuit. CMOS devices are now widely used in almost all types of semiconductor ICs including logic ICs, semiconductor memories, 1-chip micro-computers and the like.

The elements of CMOS integrated circuits are being made smaller and smaller, and the integration density of CMOS integrated circuits is increasing. As the integration density increases, the impurity concentration of the substrate or well region of each CMOS integrated circuit is generally increased in order to electrically isolate the elements more reliably or to improve the short-channel effect of transistors.

However, the higher the impurity concentration of the well region, the more prominent the influence of the back-gate bias effect, which effect has hitherto been neglected. Inevitably, the NMOSs and PMOSs provided in the well region have threshold voltages much higher than design values. In particular, a MOSFET having a small channel width has its threshold voltage markedly increased due to the back-gate bias effect. The more its threshold voltage is raised, the more the MOSFET will be deteriorated in terms of current-driving ability.

The trend has been that the number of functions performed by CMOS integrated circuits has increased. In other words, more and more circuits of various functions are incorporated in one chip. A single chip contains blocks having high integration density (e.g., the core of a semiconductor memory) and blocks having low integration density (e.g., a voltage booster and an input/output circuit). The MOSFETs incorporated in any high-density block differ in size from those provided in any low-density block. The difference in MOSFET size increases in proportion to the integration density of the high-density block, as is observed at present in the CMOS integrated circuits.

The greater the difference in MOSFET size between a high-density block and a low-density block becomes, the more difficult it is for the MOSFETs to have respective threshold voltages at the design values. This is because channel ions need to be implanted to form MOSFETs in many separate steps under different conditions selected in accordance with the sizes of the MOSFETs. As many masks as the steps of implanting channel ions are required. The many steps performed and the many masks increase the manufacturing cost of, and decreases the yield of, the CMOS integrated circuit.

There is known a CMOS device which has a plurality of well regions having different impurity concentrations so that MOSFETs provided in them may have respective threshold voltages of design values. Such a CMOS device is disclosed in Jpn. Pat. Appln. KOKAI Publication No. 4-3468. Having different impurity concentrations and formed in a substrate, the well regions must be spaced apart from one another by some distance. Furthermore, each well region needs to have a contact hole for applying bias potentials. As a consequence, the CMOS device cannot be made small.

SUMMARY OF THE INVENTION

The first object of the present invention is to provide a semiconductor device the elements of which can be made small and in which adverse influence of back-gate bias effect is mitigated, and to provide a method of manufacturing this semiconductor device.

The second object of the invention is to provide a semiconductor device the elements of which can be made small and in which transistors can easily have different threshold voltages, and to provide a method of manufacturing the semiconductor device.

The third object of this invention is to provide a semiconductor device the elements of which can be made small and in which the threshold voltages of transistors are prevented from increasing despite the adverse influence of back-gate bias effect, and to provide a method of manufacturing this semiconductor device.

The fourth object of the invention is to provide a semiconductor device comprising an integrated circuit section in which the threshold voltages of transistors are prevented from increasing despite the adverse influence of back-gate bias effect, and to provide a method of manufacturing the semiconductor device.

The fifth object of the present invention is to provide a semiconductor device comprising a logic circuit section in which the threshold voltages of transistors are prevented from increasing despite the adverse influence of back-gate bias effect, and to provide a method of manufacturing the semiconductor device.

The sixth object of the invention is to provide a semiconductor device comprising a circuit section in which the threshold voltages of transistors are prevented from increasing despite the adverse influence of back-gate bias effect, and to provide a method of manufacturing the semiconductor device.

The seventh object of this invention is to provide a semiconductor memory device having memory cells, each including a transfer transistor whose threshold voltage is prevented from increasing despite the adverse influence of back-gate bias effect, and to provide a method of manufacturing the semiconductor memory device.

The eighth object of the invention is to provide a semiconductor device the elements of which can be made small and in which transistors provided in the same region can easily have different threshold voltages, and to provide a method of manufacturing the semiconductor device.

The ninth object of the present invention is to provide a semiconductor device which can be made by performing implantation of channel ions only a few times to impart various threshold voltages to transistors, and to provide a method of manufacturing the semiconductor device.

The tenth object of the invention is to provide a semiconductor device which can be made by using a small number of masks, and to provide a method of manufacturing the semiconductor device.

To achieve the objects described above, there is provided a semiconductor device according to the invention, which comprises a semiconductor device comprising: a semiconductor substrate; a well region formed in the semiconductor substrate, the well region including a first portion having a first surface impurity concentration and a second portion having a second surface impurity concentration higher than the first surface impurity concentration; insulated-gate field-effect transistors formed in the well region, each of the insulated-gate field-effect transistors having a channel region and the channel region of at least one of the insulated-gate field-effect transistors formed in the first portion of the well region having the first surface impurity concentration.

To accomplish the objects described above, there is provided a method of manufacturing a semiconductor device, according to the invention, which comprises the steps of: a method of manufacturing a semiconductor device, comprising the steps of: preparing a semiconductor substrate; defining a well formation region on the semiconductor substrate; defining on the well formation region a first channel formation region for a first insulated-gate field-effect transistor and a second channel formation region for a second insulated-gate field-field transistor; forming a first impurity shielding layer on the semiconductor substrate except the well formation region, and a second impurity shielding layer on at least one of the first and second channel formation regions; and introducing impurities into the semiconductor substrate using the first and second impurity shielding layers as a mask, thereby forming a well region in the well formation.

In the semiconductor device and the method of manufacturing a semiconductor device, both according to this invention, the first portion of the well region which is the channel region of at least one of the insulated-gate field-effect transistors has an impurity concentration in its near-surface region which is lower than the impurity concentration of the near-surface region of another portion of the well region. The threshold voltage of the insulated-gate field-effect transistor can therefore be adjusted. More precisely, the threshold voltage of the transistor can easily be set at any desired value by implanting channel ions or by not implanting channel ions at all. Hence, many masks need not be used to manufacture the semiconductor device. The semiconductor device can be manufactured at low cost with high yield.

As described above, the insulated-gate field-effect transistors are provided in a sole well region, and the first portion of the well region which is the channel region of at least one transistor has an impurity concentration in its near-surface region which is lower than the impurity concentration of the near-surface region of another portion of the well region. There is no need to space apart well regions or to form a contact hole, as in a semiconductor device which has a plurality of well regions having different impurity concentrations. The elements of the semiconductor device according to the invention can therefore be made small.

Moreover, since at least one of the insulated-gate field-effect transistors has a channel region which is the near-surface region of the first portion of the well region which has a low impurity concentration, the threshold voltage of this transistor is influenced but a little by the back-gate bias effect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4A is a plan view of an example of a resist pattern which can be used in the step explained with reference to FIG. 3B;

FIG. 4B is a plan view of the well formed by using the resist pattern of FIG. 4A;

FIG. 5A is a plan view of another example of a resist pattern which can be used in the step explained with reference to FIG. 3B;

FIG. 5B is a plan view of the well formed by using the resist pattern of FIG. 5A;

FIG. 16 is a circuit diagram of a transfer gate for use in a semiconductor device according the fifth embodiment of this invention;

FIG. 17 is a circuit diagram of another transfer gate for used in a semiconductor device according the fifth embodiment of the invention;

FIG. 18A is a circuit diagram of a resistor comprising a MOSFET, for use in a semiconductor device according the fifth embodiment of this invention;

FIG. 18B is a diagram showing a circuit having a barrier transistor;

FIG. 19A is a circuit diagram showing a bit-line pair selecting gate for use in a dynamic RAM;

FIG. 19B is is a plan view of that section of the bit-line pair selecting gate, in which NMOS are provided;

FIG. 20A is a symbol for a two-input NAND gate circuit to which the present invention is applied;

FIG. 20B is a circuit diagram showing the two-input NAND gate circuit;

FIG. 20C is a sectional view of the two-input NAND circuit;

FIG. 21A is a symbol for a three-input NAND gate circuit to which this invention is applied;

FIG. 21B is a circuit diagram showing the three-input NAND gate circuit;

FIG. 21C is a sectional view of the three-input NAND circuit;

FIG. 22A is a symbol for a two-input NOR gate circuit to which the invention is applied;

FIG. 22B is a circuit diagram showing the two-input NOR gate circuit;

FIG. 22C is a sectional view of the two-input NOR circuit;

FIG. 25A is a plan view of the OR-NAND gate circuit shown in FIG. 24B;

FIG. 25B is a sectional view taken along line 25B—25B in FIG. 25A;

FIG. 25C is a sectional view taken along line 25C—25C in FIG. 25A;

FIG. 26A is a plan view of the OR-NAND gate circuit shown in FIG. 24C;

FIG. 26B is a sectional view taken along line 26B—26B in FIG. 26A;

FIG. 26C is a sectional view taken along line 26C—26C in FIG. 26A;

FIG. 29A is a plan view of the AND-NOR gate circuit shown in FIG. 27C;

FIG. 29B is a sectional view taken along line 29B—29B in FIG. 29A;

FIG. 29C is a sectional view taken along line 29C—29C in FIG. 29A;

FIG. 30A is a symbol for a 2OR-NAND gate circuit to which this invention is applied;

FIG. 30B is a circuit diagram of the 2OR-NAND gate circuit;

FIG. 31A is a plan view of the 2OR-NAND gate circuit shown in FIG. 30B;

FIG. 31B is a sectional view taken along line 31B—31B in FIG. 31A;

FIG. 31C is a sectional view taken along line 31C—31C in FIG. 31A;

FIG. 32A is a symbol for a 2AND-NOR gate circuit to which the invention is applied;

FIG. 32B is a circuit diagram of the 2AND-NOR gate circuit;

FIG. 33A is a plan view of the 2AND-NOR gate circuit shown in FIG. 32B;

FIG. 33B is a sectional view taken along line 33B—33B in FIG. 33A;

FIG. 33C is a sectional view taken along line 33C—33C in FIG. 33A;

FIG. 34A is a symbol for a clocked inverter to which this invention is applied;

FIG. 34B is a circuit diagram of the clocked inverter;

FIG. 34C is a circuit diagram of another clocked inverter;

FIG. 35 is a sectional view of the circuit shown in FIG. 34B;

FIG. 36 is a sectional view of the circuit shown in FIG. 34C;

FIG. 40 is a sectional view of a DRAM with buried plate electrodes;

FIGS. 41A and 41B are perspective views explaining two of the steps of a method of manufacturing the semiconductor device to which the present invention is applied;

FIG. 41C is a perspective view of the semiconductor device completed; and

DETAILED DESCRIPTION OF THE PREFERRED EMBODIMENTS

Embodiments of the present invention will now be described with reference to the accompanying drawings.

Figure 1:
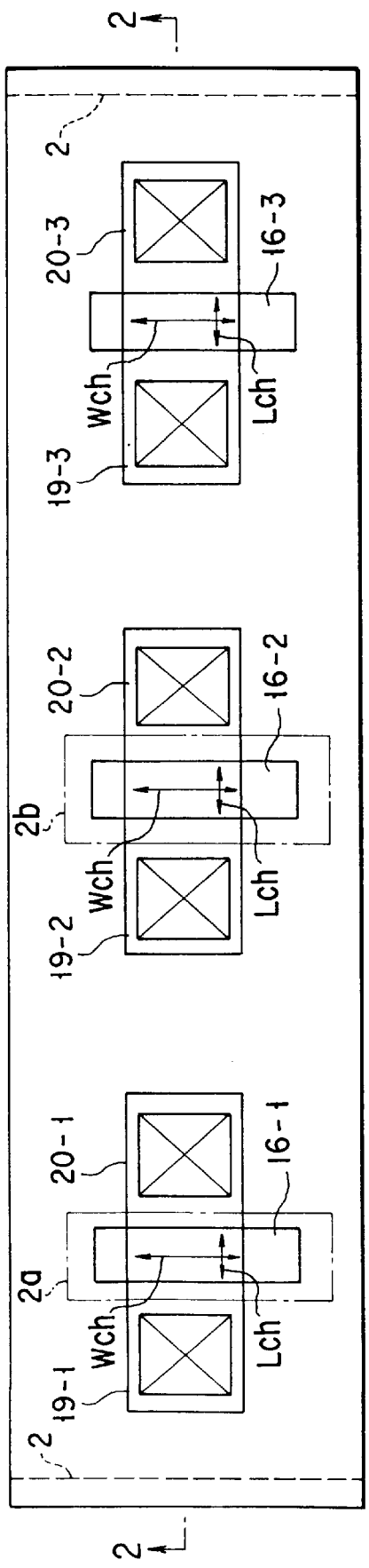
FIG. 1 is a plan view of a semiconductor device according to the first embodiment of the invention.
Figure 2:
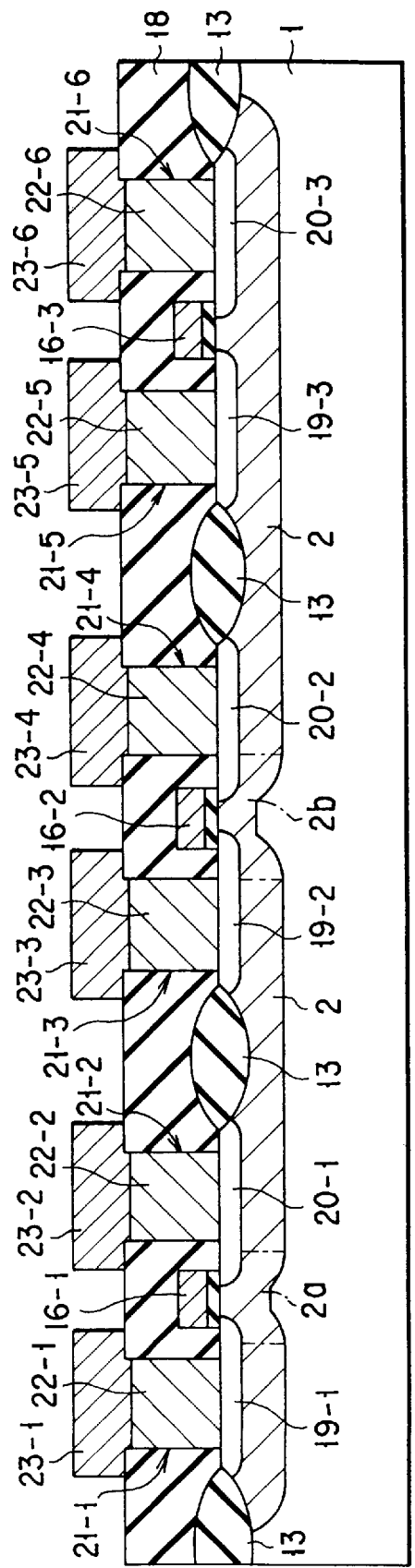
FIG. 2 is a sectional view, taken along line 2—2 in FIG. 1.

FIG. 1 is a plan view of the semiconductor device according to a first embodiment of the invention, and FIG. 2 is a sectional view, taken along line 2—2 in FIG. 1. FIGS. 3A to 3G are sectional views explaining some steps of a method of manufacturing the device shown in FIGS. 1 and 2.

The method of manufacturing the device will be explained, with reference to FIGS. 1 and 2 and FIGS. 3A to 3G.

Figure 3A:
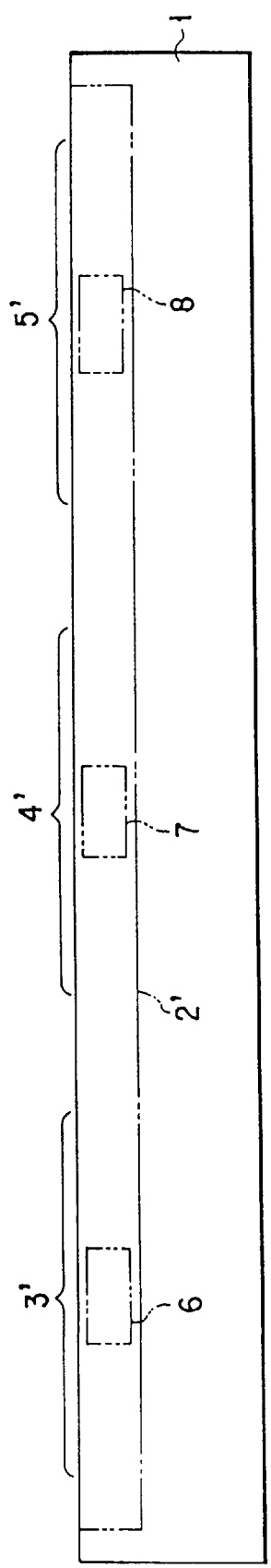
FIGS. 3A to 3G are sectional views explaining some steps of a method of manufacturing the device shown in FIGS. 1 and 2.

First, as shown in FIG. 3A, an N-type silicon substrate 1 is prepared which has an impurity concentration of about $2 \times 10^{15}$ cm$^{-3}$. The substrate 1 has a region 2' in which a P-type well region will be formed. The substrate 1 has three element regions 3', 4' and 5' in which first to third MOSFETs will be formed. It has three more regions 6, 7 and 8 (hereinafter called "channel regions") in which the channel regions of the first, second and third MOSFETs will be formed, respectively.

Figure 3B:
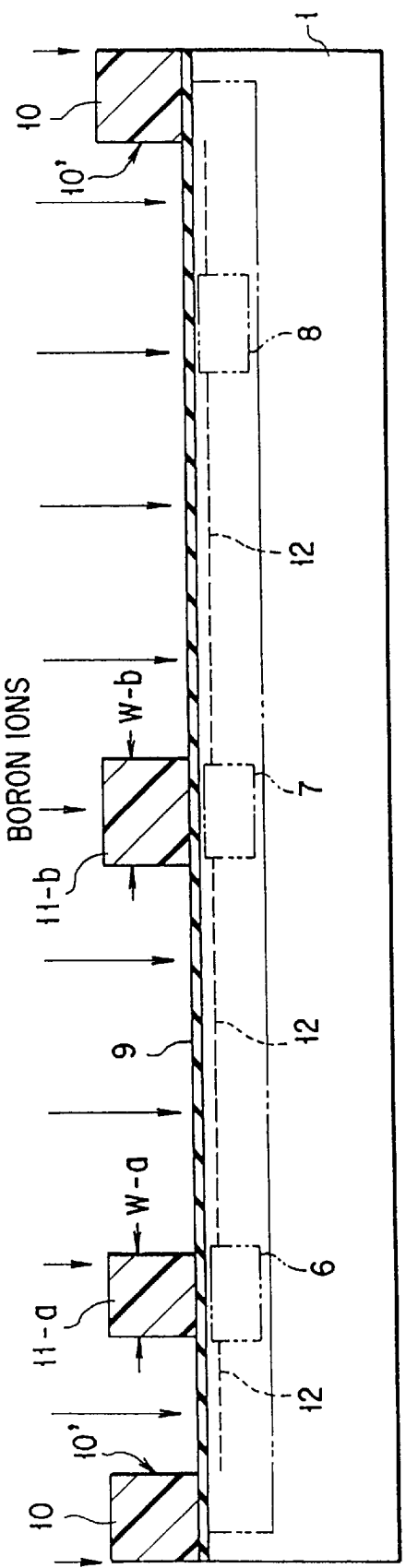

Next, as shown in FIG. 3B, the upper surface of the substrate 1 is thermally oxidized, forming an oxide ($SiO_2$) film 9. Photoresist is then coated on the oxide film 9, thereby forming a photoresist layer. The photoresist layer is patterned by photolithography, forming a resist layer 10 which will serve as a mask for forming a well region. The resist layer 10 has a window 10' which is located above the region 2' of the substrate 1. Two stripe-shaped resist layers 11-a and 11-b remain in the window 10' and are located above the channel regions 6 and 7 of the substrate 1. In the window 10', no resist layer is located above the channel region 8 of the substrate 1. The stripe-shaped resist layers 11-a and 11-b extend along the channel width of the first and second MOSFETs which will be formed. The resist layers 11-a and 11-b form a mask for adjusting the impurity concentration of the well region. The resist layer 11-a has a width W-a of 2 μm, whereas the resist layer 11-b has a larger width W-b of 3 μm.

The resist layers 11-a and 11-b may be integral with the resist layer 10 as shown in FIG. 4A or may be separated from the resist layer 10 as shown FIG. 5A. The layers 11-a and 11-b only need to be positioned above the channel regions 6 and 7 of the substrate 1, respectively.

Referring back to FIG. 3B, boron ions are implanted into the surface region 12 of the substrate 1 by using the resist layers 11-a and 11-b as a mask, at a dose of $3 \times 10^{13}$ $cm^{-2}$ at an acceleration voltage (implant energy) of 150 keV.

Figure 3C:
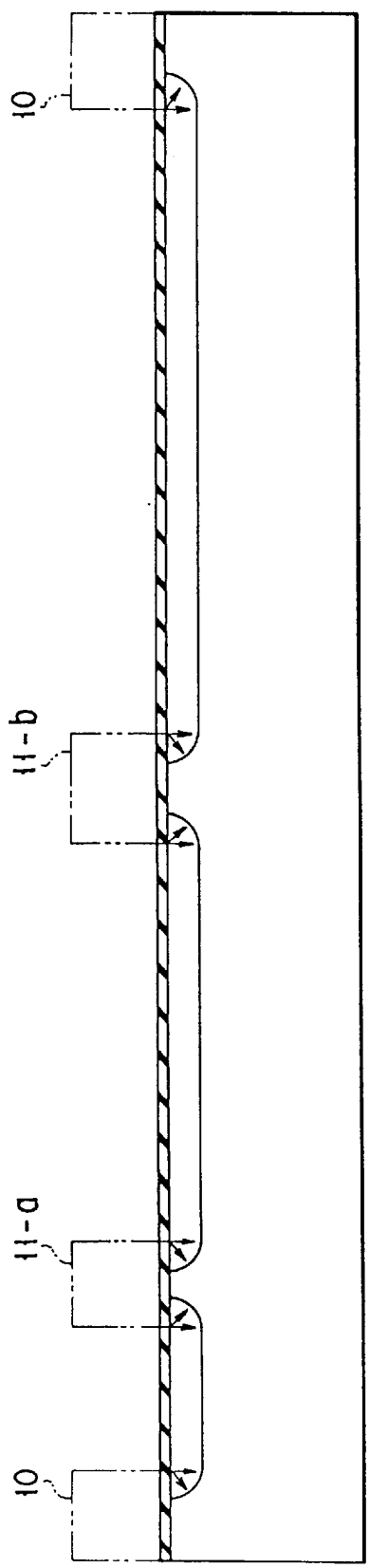
Figure 3D:
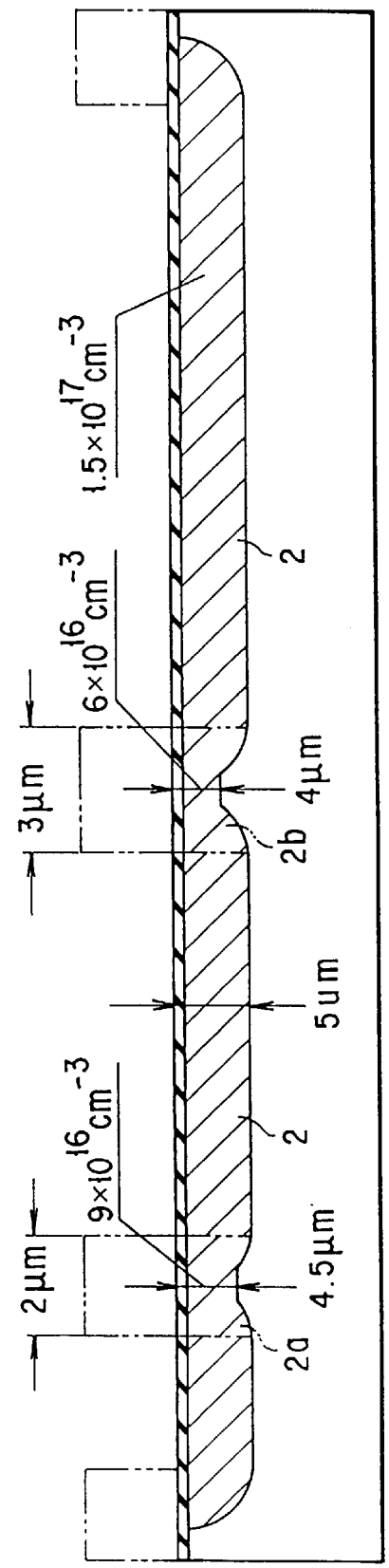

Thereafter, as shown in FIG. 3C, the resist layers 11-a and 11-b are removed from the oxide film 9, and the unfinished product is annealed at 1200° C. for about three hours. The boron is thereby diffused in the substrate 1, in both the horizontal direction and the vertical (depthwise) direction. As a result, a well region 2 is formed in the substrate 1 as is illustrated in FIG. 3D. The well region 2 has a depth of about 5 μm and a surface impurity concentration of about $1.5 \times 10^{17}$ $cm^{-3}$. The boron is diffused horizontally into those parts of the substrate 1 which were located below the resist layers 11-a and 11-b, whereby low impurity-concentration regions 2a and 2b are formed in the surface of the substrate 1. The region 2a has a depth of about 4.5 μm and a surface impurity concentration of about $9 \times 10^{16}$ $cm^{-3}$. The region 2b has a depth of about 4 μm and a surface impurity concentration of about $6 \times 10^{16}$ $cm^{-3}$.

The well region 2 assumes the shape shown in FIG. 4B, as viewed from above, if it has been formed by using the resist pattern of FIG. 4A. Alternatively, it has the shape shown in 5B, as viewed from the above, if it has been formed by using the resist pattern of FIG. 5A.

Figure 6A:
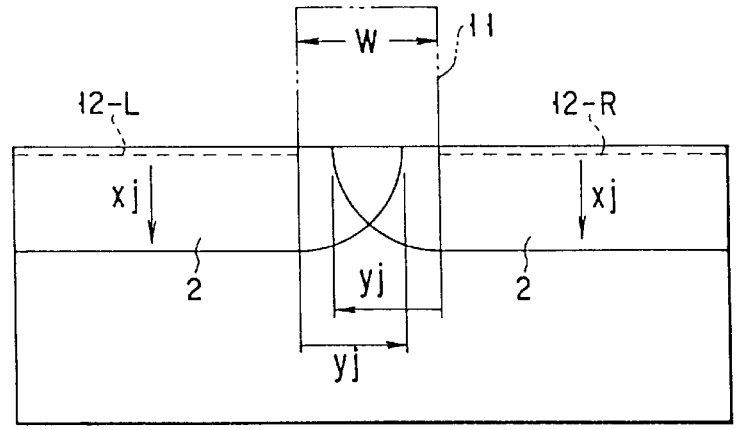
FIGS. 6A and 6B are sectional views of a part of the device shown in FIGS. 1 and 2, explaining two types of impurity diffusion.

As shown in FIG. 6A, boron ions 12-R implanted in the substrate 1 along the right side of either resist layer 11 gradually diffuse in the horizontal direction, while boron ions 12-L implanted in the substrate 1 along the left side of either resist layer 11 gradually diffuse in the horizontal direction. Eventually, the boron ions 12-R contact the boron ions 12-L in that part of the substrate 1 which is located below the resist layer 11, for a horizontal distance $y_j$. The state in which the boron ions 12-R contact the boron ions 12-L can be changed in various ways, thereby to adjust to a desired value the surface impurity concentration of that part of the substrate 1 which is located below the resist layer 11. To change the state in which the boron ions of the first group contact those of the second group, the width W of the resist layer 11 may be changed.

Figure 7:
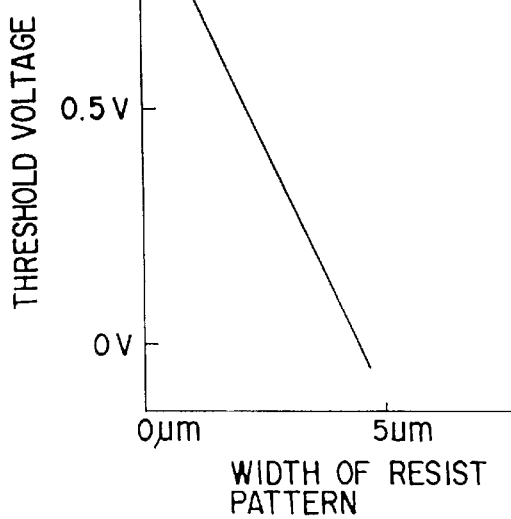
FIG. 7 is a diagram representing the relationship between the pattern width of a resist layer and the threshold voltage of a transistor.

FIG. 7 represents the relationship between the pattern width W of the resist layer 11 and the threshold voltage of the MOSFET. As is evident from FIG. 7, the greater the pattern width W, the lower the threshold voltage of the MOSFET. This means that as the pattern width W is increased, that part of the well region 2 which is located beneath the resist layer 11 has its near-surface impurity concentration decreased.

FIG. 7 indicates that the threshold voltage of the MOSFET can be changed by about 1 V at most, merely by adjusting the pattern width W of the resist layer 11. In view of this, the semiconductor device shown in FIGS. 1 and 2, which is the first embodiment of the invention, is considered practical.

Unless the boron ions 12-R contact the boron ions 12-L in that part of the substrate 1 which is located below the resist layer 11, it will be impossible to form the low impurity-concentration region 2a or 2b in that part of the substrate 1. There is an upper limit to the pattern width W, beyond which neither the region 2a nor the region 2b can be formed.

Figure 6B:
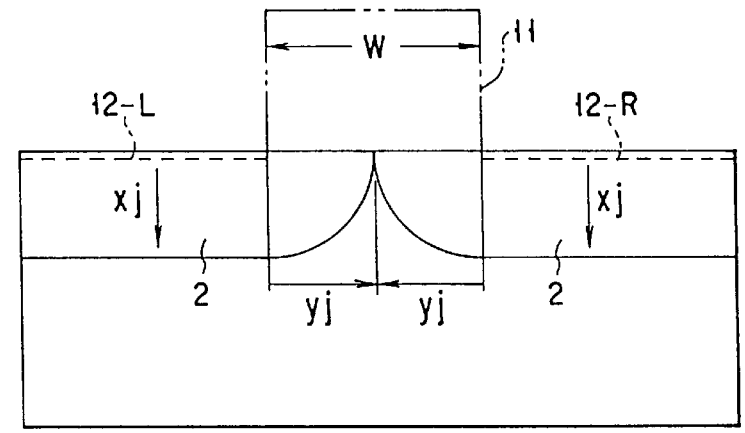

Theoretically, the upper limit to the pattern width W is twice the horizontal distance $y_j$ as is illustrated in FIG. 6B. In practice, however, the upper limit can be twice the vertical distance $x_j$ through which the boron ions 12-R and 12-L have diffused in the substrate 1. This is because the vertical distance $x_j$ and the horizontal distance $y_j$ can be regarded as almost equal to each other; that is, $y_j:x_j=1:1$.

In the first embodiment, the vertical distance $x_j$, i.e., the depth of the well region 2, is 5 μm, and the horizontal distance $y_j$ is therefore approximately 5 μm. Hence, the upper limit to the pattern width W is 10 μm (=$y_j \times 2 = x_j \times 2$).

Figure 3E:
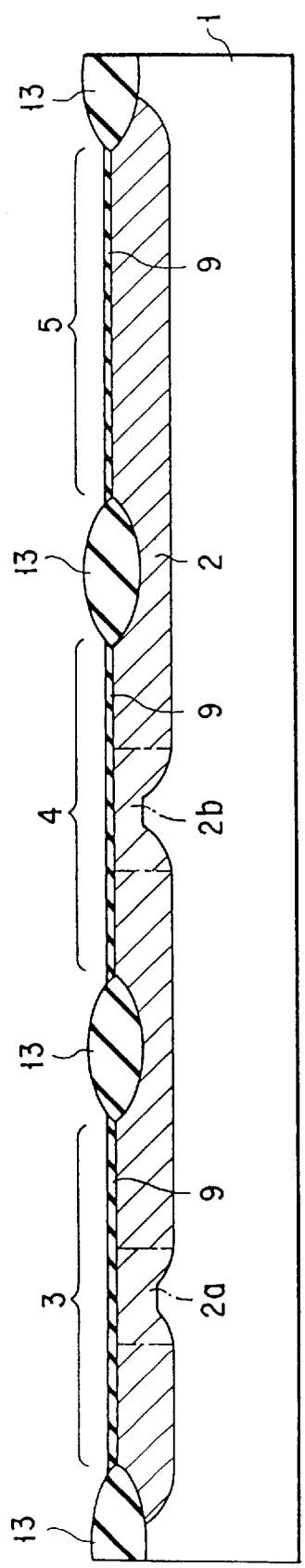

Next, as shown in FIG. 3E, selected surface parts of the substrate 1 are thermally oxidized at, for example, 1000° C. by means of the well-known LOCOS method. Field oxide films 13 about 500 nm thick are thereby formed. The field oxide films 13 demarcate three element regions 3, 4 and 5 on the upper surface of the well region 2.

Figure 3F:
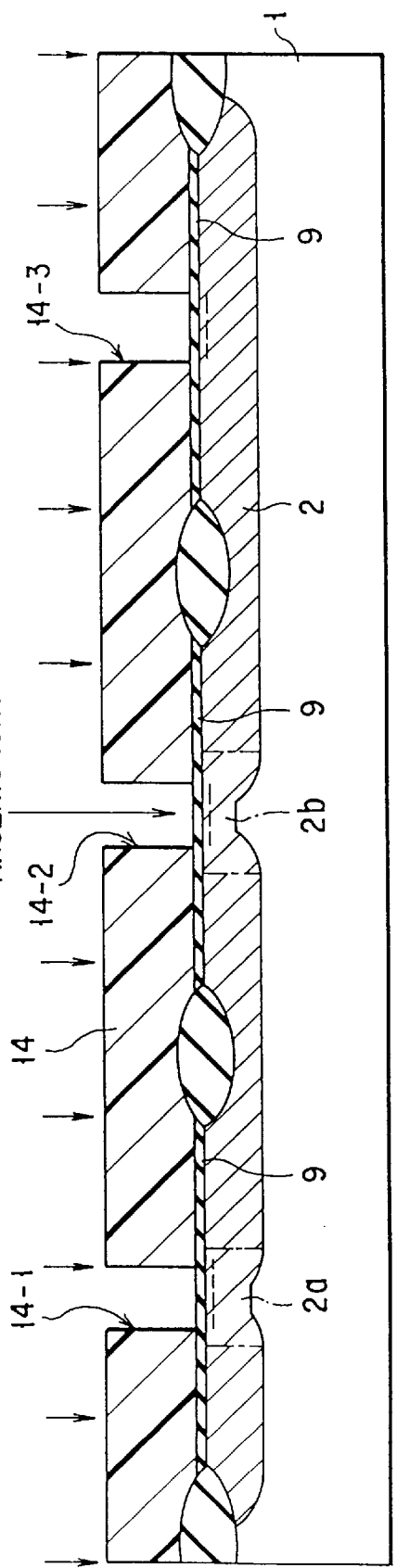

Then, as shown in FIG. 3F, photoresist is coated on the upper surface of the substrate 1, forming a photoresist layer 14. The photoresist layer 14 is subjected to photolithography, whereby windows 14-1, 14-2 and 14-3 are made in the photoresist layer 14. An impurity for controlling the threshold voltage of the MOSFETs, for example Arsenic (As), is ion-implanted through the windows 14-1, 14-2 and 14-3 into the well region 2 and the low impurity-concentration regions 2a and 2b at the same time, at a dose of $2 \times 10^{12}$ $cm^{-2}$ at an acceleration voltage of 70 keV.

The step of implanting channel ions, shown in FIG. 3F, can be omitted if the well region 2 formed in the step of FIG. 3D has an impurity concentration that provides a desired threshold voltage to the MOSFETs.

Figure 3G:
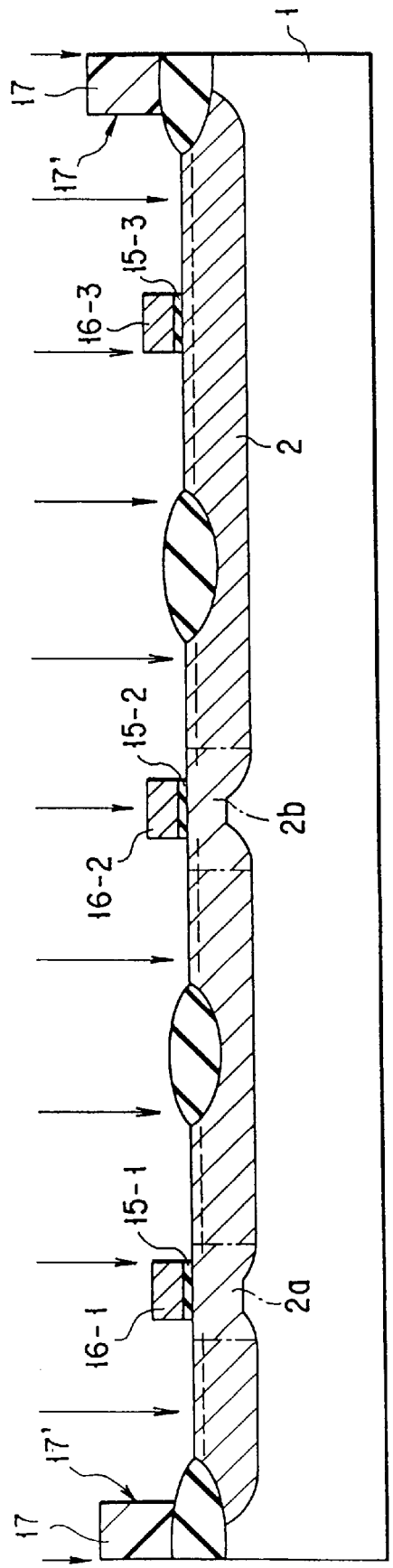

Thereafter, as shown in FIG. 3G, the photoresist layer 14 is removed, and the oxide film 9 is removed from the element regions 3 to 5. The surfaces of the element regions 3 to 5 are thermally oxidized, forming gate oxide films 15-1, 15-2 and 15-3. Gate oxide films 15-1, 15-2 and 15-3 have a thickness of about 15 nm, respectively. Next, silicon is deposited on the upper surface of the substrate 1 by means of CVD method, thereby forming a polysilicon film having a thickness of about 300 nm. Photoresist is coated on the polysilicon film, thus forming a photoresist layer. The photoresist layer is etched by photolithography, forming a gate pattern. Using the gate pattern as a mask, RIE method is performed on the polysilicon film, thereby forming gate electrodes 16-1, 16-2 and 16-3.

Then, the photoresist layer (not shown) is removed. Photoresist is coated on the upper surface of the substrate 1, forming a photoresist layer 17. The photoresist layer 17 is subjected to photolithography, whereby a window 17' is made in the layer 17, exposing the well region 2. An impurity for forming source and drains, such as arsenic (As), is ion-implanted through the window 17' into the well region 2 at a dose of $3 \times 10^{15}$ cm$^{-2}$ at an acceleration voltage of 40 keV.

Next, as shown in FIGS. 1 and 2, an insulator such as PSG is deposited on the upper surface of the substrate 1 by means of CVD method, thereby forming an inter-layer insulating film 18. Contact holes 21-1 to 21-6 are made in the interlayer insulating film 18. The contact holes 21-1, 21-3 and 21-5 expose the N-type source diffusion layers 19-1, 19-2 and 19-3, respectively, whereas the contact holes 21-2, 21-4 and 21-6 expose the N-type drain diffusion layers 20-1, 20-2 and 20-3, respectively. Tungsten (W) is deposited in the contact holes 21-1 to 21-6, forming therein tungsten layers 22-1 to 22-6. Then, aluminum (Al) is deposited on the interlayer insulating film 18 and also on the tungsten layers 22-1 to 22-6, thereby forming an aluminum layer. Photoresist is coated on the aluminum layer, forming a photoresist layer. The photoresist layer is etched by photolithography, forming a wire pattern. Using the wire pattern as a mask, the aluminum layer is etching by RIE method, thereby forming aluminum wires 23-1 to 23-6.

Figure 9A:
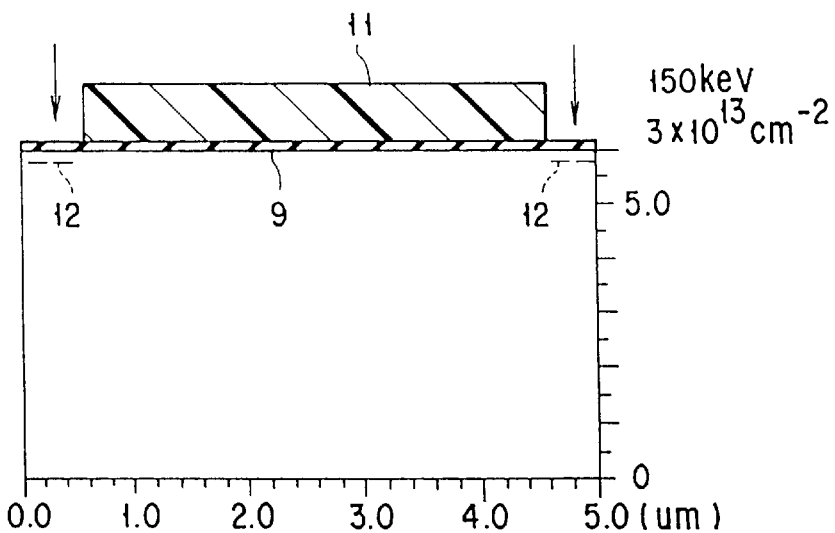
FIGS. 9A to 9C are sectional views, showing how the impurity concentration is distributed in three of the steps of the method of manufacturing the device shown in FIGS. 1 and 2.
Figure 9B:
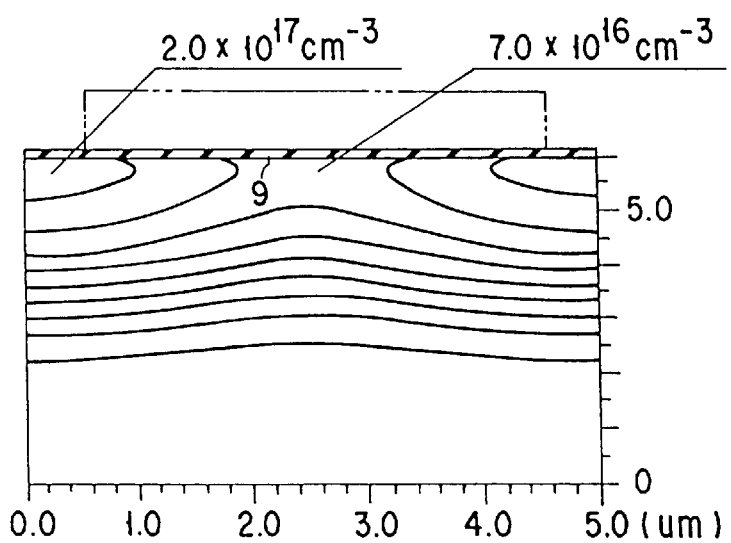
Figure 9C:
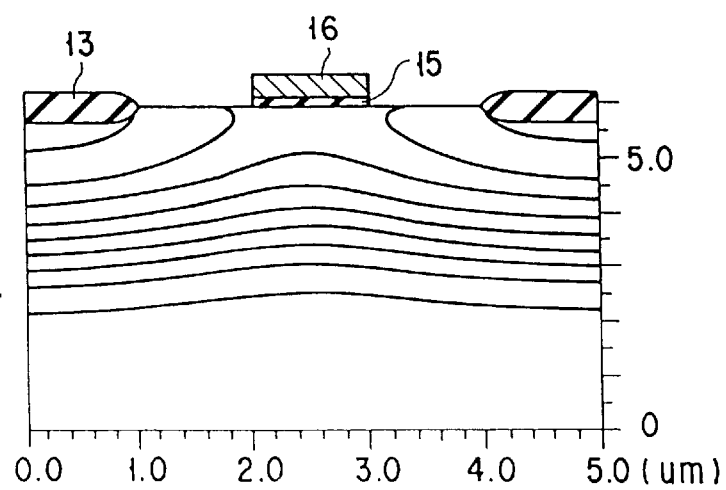

FIGS. 9A to 9C are sectional views, showing how the impurity concentration is distributed in three of the steps of the method of manufacturing the semiconductor device shown in FIGS. 1 and 2. In FIGS. 9A to 9C, distance scales in units of microns ($\mu$m) are plotted on the ordinate and abscissa.

As is evident from FIG. 9C in particular, each element region horizontally extends from the 1 $\mu$m-point to the 4 $\mu$m-point. The gate electrode 16 horizontally extends from the 2 $\mu$m-point to the 3 $\mu$m-point. A field oxide film 13 horizontally extends from the 0 $\mu$m-point to the 1 $\mu$m-point, and another field oxide film 13 horizontally extends from the 4 $\mu$m-point to the 5 $\mu$m-point. The well region has an impurity concentration of $7.0 \times 10^{16}$ cm$^{-3}$ in that part located below the gate electrode 16, and has a higher impurity concentration of $2 \times 10^{17}$ cm$^{-3}$ in those parts located beneath the field oxide films 13. Namely, in the first embodiment, that part of the well region which is located below each gate electrode 26 has a lower impurity concentration than any other part of the well region.

Figure 10:
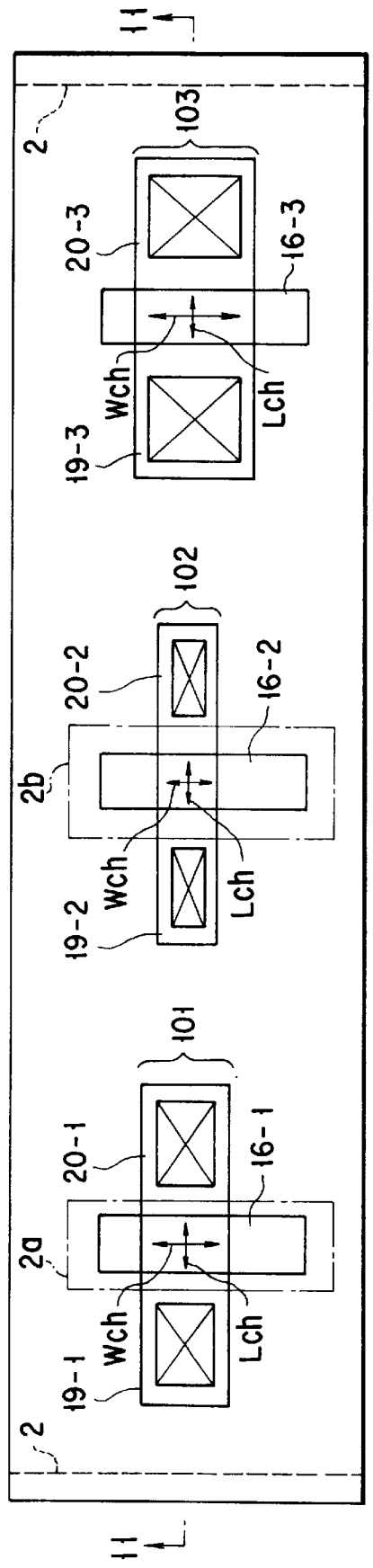
FIG. 10 is a plan view of a semiconductor device according to the first embodiment of the invention.

A semiconductor device in accordance with a second embodiment of the invention will be described, with reference to FIGS. 10 and 11. FIG. 10 is a plan view of this semiconductor device, and FIG. 11 is a sectional view, taken along line 11—11 in FIG. 10.

Figure 11:
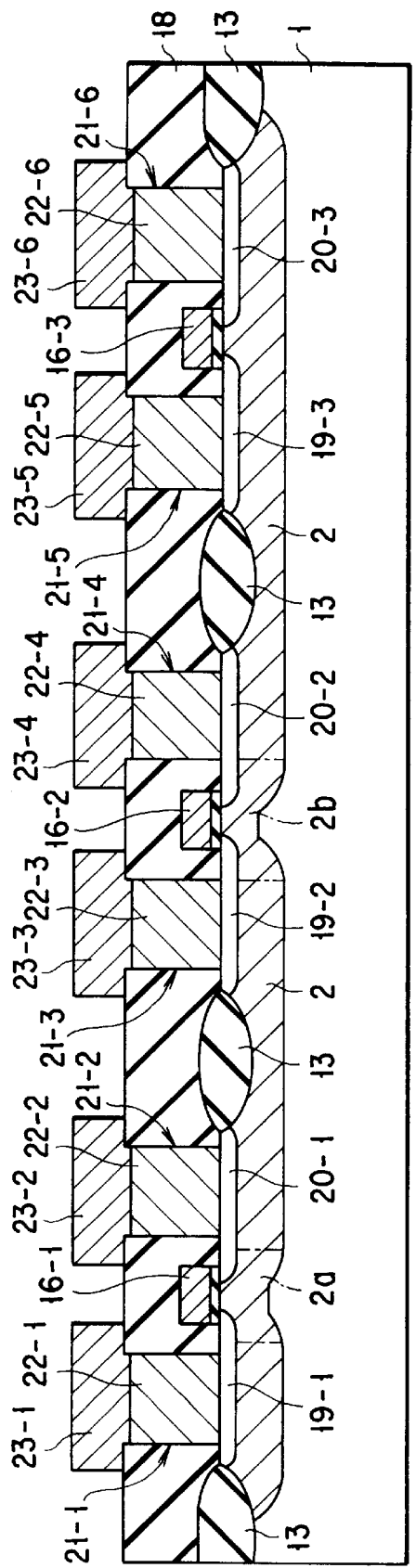
FIG. 11 is a sectional view, taken along line 11—11 in FIG. 10.

As shown in FIGS. 10 and 11, the channel of the first MOSFET 101 has a width-to-length ratio Wch/Lch of 1.5/1; the channel of the second MOSFET 102 has a width-to-length ratio Wch/Lch of 1/1; and the channel of the third MOSFET 103 has a width-to-length ratio Wch/Lch of 2/1.

In a semiconductor device having a plurality of MOSFETs with different channel widths Wch, that part of the well region in which any MOSFET with a small Wch has a low impurity concentration. This is because, the smaller the channel width Wch, the more the threshold voltage of the MOSFET increases due to back-gate bias effect. In the second embodiment, the second MOSFET 102 with the smallest Wch is provided in the low impurity-concentration region 2b which has the lowest surface impurity concentration; the first MOSFET 101 is provided in the low impurity-concentration region 2a which has the second lowest surface impurity concentration; and the third MOSFET 103 with the largest Wch is provided in the well region 2 which has the highest surface impurity concentration. In other words, the smaller the channel width Wch of the MOSFET, the lower the surface impurity concentration of the region in which the MOSFET is provided. By taking this measure, the adverse influence of the back-gate bias effect is effectively mitigated, thereby minimizing any increase in the threshold voltage of each MOSFET.

In the second embodiment, the adverse influence of the back-gate bias effect may be effectively mitigated, if the MOSFET with the smallest gate width is provided in the region which has the lowest surface impurity concentration, the MOSFET with the next smallest gate width is provided in the region which has the second lowest surface impurity concentration, and the MOSFET with the largest gate width is provided in the region which has the highest surface impurity concentration.

Figure 12:
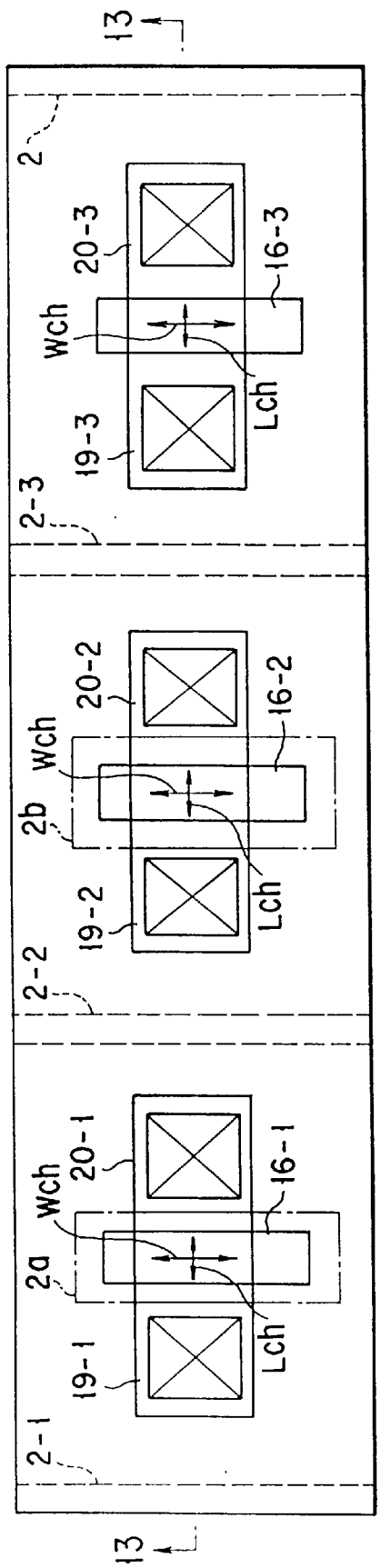
FIG. 12 is a plan view of a semiconductor device according to the third embodiment of the invention.
Figure 13:
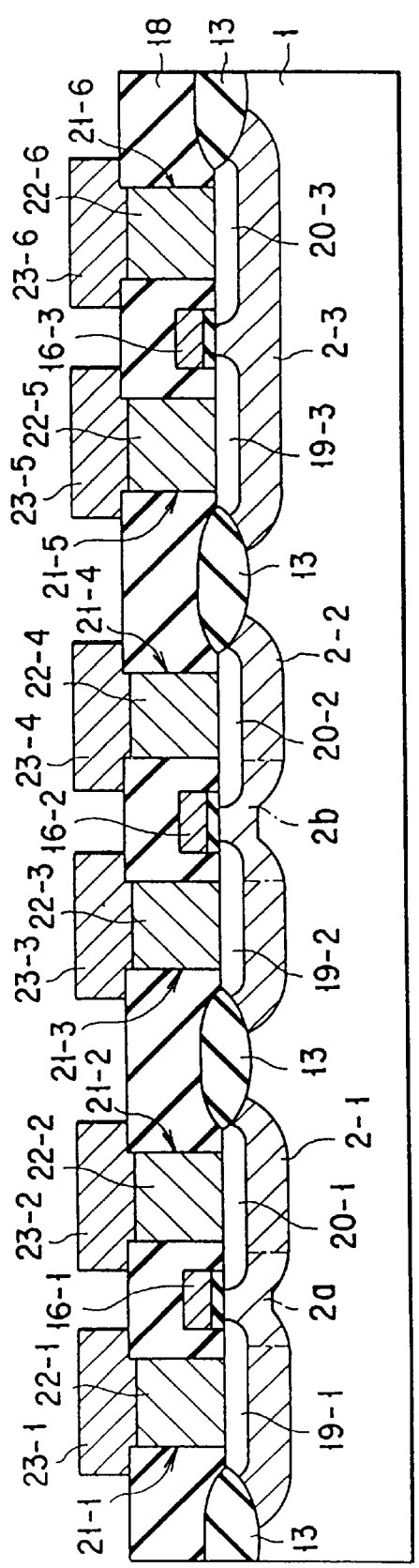
FIG. 13 is a sectional view, taken along line 13—13 in FIG. 12.

A semiconductor device in accordance with a third embodiment of the present invention is shown in FIGS. 12 and 13. FIG. 12 is a plan view of this semiconductor device, and FIG. 13 is a sectional view, taken along line 13—13 in FIG. 12. As seen from these figures, the third embodiment is characterized in that three separate well regions 2-1, 2-2 and 2-3 are provided in the substrate 1. It differs from the first and second embodiments in which only one well region 2 is provided in the substrate 1.

Figure 14:
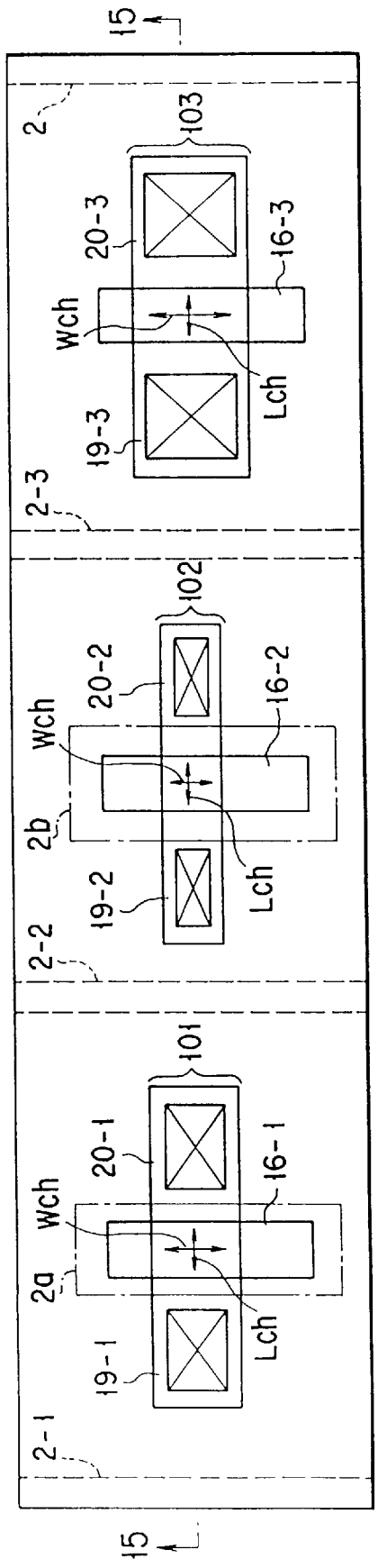
FIG. 14 is a plan view of a semiconductor device according to the fourth embodiment of the invention.
Figure 15:
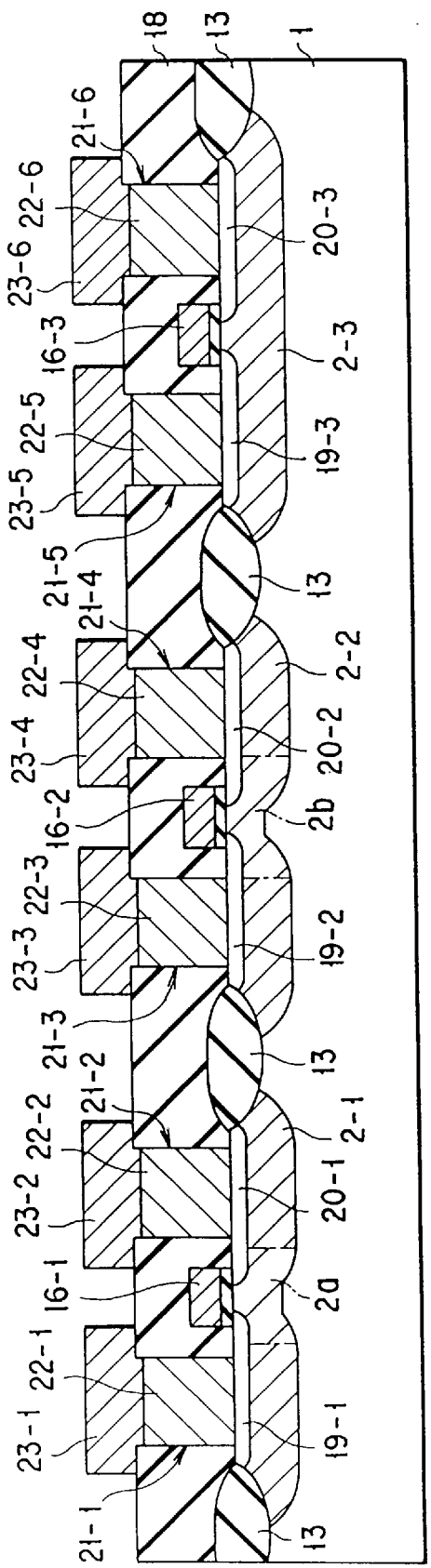
FIG. 15 is a sectional view, taken along line 15—15 in FIG. 14.

A semiconductor device in accordance with a fourth embodiment of the present invention is shown in FIGS. 14 and 15. FIG. 14 is a plan view of the semiconductor device, and FIG. 15 is a sectional view, taken along line 15—15 in FIG. 14. As evident from FIGS. 14 and 15, the fourth embodiment is characterized in two respects. First, three separate well regions 2-1, 2-2 and 2-3 are provided in the substrate 1. Second, three MOSFETs 101 to 103 having different channel widths are provided in the well regions 2-1, 2-2 and 2-3, respectively.

A semiconductor device in accordance with a fifth embodiment of this invention will be described.

Among MOSFETs which are susceptible to the influence of back-gate bias effect are those whose source potential is close to the high power-supply potential of the circuit in which they are used. Examples of such MOSFETs are the pass transistors shown in FIGS. 16 and 17, both forming transfer gates (bidirectional switches), and a MOSFET shown in FIG. 18A used as a resistor or a barrier transistor. Each of the MOSFETs shown in FIGS. 16 to 18A is characterized in that its source potential is different from the back-gate bias potential.

FIG. 18B is a diagram showing a circuit having a MOSFET TrB which confines carriers in a node A2 and which is hence known as "barrier transistor."

As shown in FIG. 18B, the circuit comprises the MOSFET TrB and a MOSFET TrD. The current path of the MOSFET TrB is connected at one end to a node A1 and at the other end to the node A2. The gate of the MOSFET TrB is connected to a terminal to which the VCC potential is applied. The current path of the MOSFET TrD is connected at one end to a node A3 and at the other end to a node A4. The gate of the MOSFET TrD is connected to the node A2. The MOSFET TrD is used to transfer a signal from the node A3 to the node A4, and the MOSFET TrB is used to transfer a signal from the node A1 to the node A2 (i.e., the gate of the MOSFET TrD). The MOSFET TrB increases the potential of the node A2, whereby a high potential is applied to the gate of the MOSFET TrD. When its gate is set at the high potential, the MOSFET TrD becomes able to transfer a signal whose voltage drops but a little.

How the MOSFET TrB confines carriers in the node A2 will be explained. When the potential of the node A1 is raised from 0V to the VCC level, the potential of the node A2 changes to VCC−Vth, where Vth is the threshold voltage of the MOSFET TrB. When the potential of the node A3 is then raised from 0V to the VCC level (or the VPP level), the source S and gate G of the MOSFET TrD are electrically coupled together. As a result, the potential of the node A2 is boosted. The lower the threshold voltage Vth, the greater the rise of the potential of the node A2.

The circuit of FIG. 18B may be used as a word-line driver. If this is the case, it is the MOSFET TrD that drives a word line.

In an NMOS incorporated in a circuit, for example, the high power-supply potential Vcc of the circuit is added in effect to the substrate potential if the source potential is close to the high power-supply potential Vcc. Inevitably, the back-gate bias greatly influences the NMOS. As a consequence of this, the threshold voltage of the NMOS increases, the NMOS has its current-driving ability impaired at a predetermined gate potential.

One typical circuit having such MOSFETs is a bit-line pair selecting gate designed to select and activate some of the bit-line pairs arranged in a memory-cell array. A bit-line pair selecting gate (a so-called φT gate) is incorporated in, for example, a dynamic RAM (DRAM) of the shared sense amplifier type.

FIG. 19A is a circuit diagram of a bit-line pair selecting gate used in a DRAM. As shown in FIG. 19A, a group 30 of memory cells, each including a transfer transistor and a data-storing capacitor, is connected to one end of a bit line BL and also to one end of a bit line BBL. (The bit line BBL is opposite in polarity to the bit line BL.) The transfer transistors of the memory cells of the group 30 have their gates connected to the word lines WL0 to WLn, their drains connected to the bit lines BL and BBL and their sources connected to the data-storing capacitors associated with the transfer transistors. A plate potential is applied to the plate electrodes of the data-storing capacitors of the memory cells of the group 30.

Data lines DQ and BDQ are connected to the other end of the bit line BL and the other end of the bit line BBL, respectively. (The data line BDQ is opposite in polarity to the data line DQ.) More precisely, the data lines DQ and BDQ are connected to the bit lines BL and BBL by a sense circuit 31 and a column selecting gate (not shown). The sense circuit 31 includes a PMOS flip-flop 32 and an NMOS flip-flop 33. A bit-line pair selecting gate 34 is located between the PMOS flip-flop 32 and the NMOS flip-flop 33 and connected in series thereto.

The bit-line pair selecting gate 34 is a switch provided in a signal transfer path. The gate 34 includes NMOSs 35 and 36. The source-drain path of the NMOS 35 is part of the bit line BL, while the source-drain path of the NMOS 36 is part of the bit line BBL. The source potentials of the NMOSs 35 and 36 differ from the substrate potential and rises to a value close to the power-supply potential for some time while the NMOSs 35 and 36 are operating.

For instance, while the bit lines BL and BBL remain pre-charged, the source potentials of the NMOSs 35 and 36 are at a high potential. When the bit line BL is set to either "H" level or "L" level, the NMOS 35 is greatly influenced by the back-gate bias effect to have its threshold voltage increased and subsequently have its current-driving ability impaired. Similarly, when the bit line BBL is set to either "H" level or "L" level, the NMOS 36 is greatly influenced by the back-gate bias effect to have its threshold voltage increased and subsequently have its current-driving ability impaired.

FIG. 19B shows a typical pattern for the NMOS section of the circuit of FIG. 19A. As shown in FIG. 19B, the NMOS 37 and 38 constituting the NMOS flip-flop 33 are provided in a well region 2, intersecting the bit line BL and the bit line BBL, respectively. In contrast, the NMOS 35 and 36 provided also in the well region 2 extend parallel to the bit lines BL and BBL, respectively, not intersecting with either bit line.

As can be understood from FIG. 19B, the NMOSs 37 and 38 each have a broad channel width. Their channel widths are so broad that they have a current-driving ability sufficient to invert the potentials of the bit lines BL and BBL completely. On the other hand, their channel lengths are relatively short so that the DRAM may have an integration density as high as is desired.

The less the channel lengths of the NMOSs 37 and 38, the less the channel widths the NMOSs 35 and 36 need to have. A MOSFET having a narrow channel width has a small current-driving ability. To make matters worse, the NMOSs 35 and 36 are likely to be influenced by the back-gate bias effect since their source potentials differ from the bias potential. The threshold voltages of the NMOSs 35 and 36 unavoidably increase since their channel widths are small and they are provided as shown in FIG. 19B the bit lines BL and BBL. Consequently, the current-driving abilities of the NMOSs 35 and 36 are much impaired and cannot be as adequate as is required.

The NMOSs 37 and 38 may be shortened in the channel direction to increase the integration density of the DRAM. If this is the case, it is desirable that the NMOSs 35 and 36 be formed in a low impurity-concentration region 2a as illustrated in FIG. 19B. Provided in the low impurity-concentration region 2a, both NMOSs 35 and 36 have a threshold voltage increased but a little, despite their small channel widths and their positions with respect to the bit lines BL and BBL. As a result, their current-driving abilities remain adequate.

Figure 8:
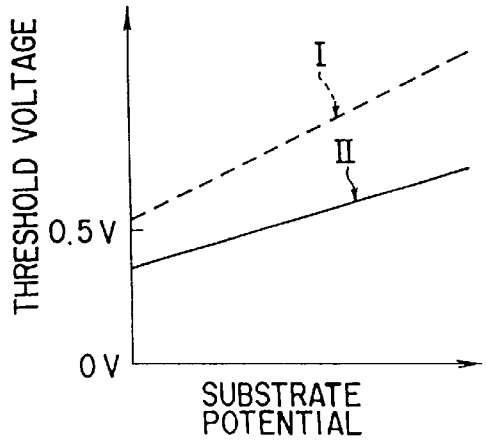
FIG. 8 is a diagram illustrating the relationship between the substrate potential and threshold voltage which an NMOS has in a bit-line pair selecting gate.

FIG. 8 is a diagram illustrating the relationship between the substrate potential and threshold voltage each NMOS has in the bit-line pair selecting gate 34. The substrate potential indicated in FIG. 8 is of a value determined in consideration of the back-gate bias effect. To be more specific, it is a sum of the back-gate bias potential (i.e., 0V in most cases) and the source potential which each NMOS has in the bit-line pair selecting gate 34.

If the NMOS 35 or the NMOS 36 were not provided in the low impurity-concentration region 2a, the threshold voltage of either NMOS would increase as its substrate potential rises, as evident from curve I in FIG. 8. In the bit-line pair selecting gate of FIGS. 19A and 19B, both NMOS 35 and 36 are formed in the low impurity-concentration region 2a. Hence, the threshold voltage of both NMOSs 35 and 36 has a low initial value and does not increase sharply as the substrate potential rises, as seen from curve II shown in FIG. 8. It should be noted that the threshold voltage indicated in FIG. 8 has been measured of MOSFETs which have a width-to-length ratio Wch/Lch of 1/1.

As can be clearly understood from FIG. 8, the NMOSs 35 and 36, both provided in the low impurity-concentration region 2a, have their threshold voltages increased, but only slightly, as their substrate potentials rise. In the NMOSs 35 and 36, a sufficient current can therefore be supplied from the drain to the source.

As a result, although the NMOS 35 separates a metal wiring layer serving as the bit line BL into two wiring layers 39-1 and 39-2, and the NMOS 36 separates a metal wiring layer serving as the bit line BBL into two wiring layers, as shown in FIG. 19B, a sufficient current can be supplied in two directions—from the wiring layer 39-1 to the wiring layer 39-2, and from the wiring layer 39-2 to the wiring layer 39-1.

Various logic gates to which the present invention is applied will be described below.

FIG. 20A is a symbol for a two-input NAND gate circuit to which the invention is applied, FIG. 20B is a circuit diagram of the two-input NAND gate circuit, and FIG. 20C is a sectional view this NAND gate circuit.

The two-input NAND gate circuit represented by the symbol of FIG. 20A has the configuration shown in FIG. 20B if produced in the form of a CMOS semiconductor device. As shown in FIG. 20B, the two-input NAND gate circuit includes PMOSs P1 and P2 and NMOSs N1 and N2. The PMOSs P1 and P2 are connected in parallel, between a high-potential power supply Vcc and an output terminal. The NMOSs N1 and N2 are connected in series, between a ground terminal and the output terminal. The source potential of the NMOS N2 is applied from the drain of the NMOS N1; it differs from the back-gate bias potential (the ground potential). In the gate circuit, the NMOS N2 is susceptible to the influence of the back-gate bias effect. In order to reduce the influence of this effect, boron used to form a well region 2 is implanted into an N-type silicon substrate 1 through a resist mask covering the channel region of the NMOS N2, thereby forming a low impurity-concentration region 2a beneath the gate electrode of the NMOS N2 as illustrated in FIG. 20C. The well region 2 therefore has its impurity concentration decreased in that part close to the channel region of the NMOS N2. As a result of this, the back-gate bias effect is influences the NMOS N2, but only slightly. In addition, the NMOS N2 does not occupy a large area since the low impurity-concentration region 2a is that part of the well region 2 which is located beneath the gate electrode and into which two groups of boron ions have diffused horizontally. Furthermore, it can be made sufficient to implant boron ions only once, by adjusting the distance over which the two groups of boron ions overlap in the low impurity-concentration region 2a.

FIG. 21A is a symbol for a three-input NAND gate circuit to which this invention is applied, FIG. 21B is a circuit diagram of the three-input NAND gate circuit, and FIG. 21C is a sectional view of this circuit.

The three-input NAND gate circuit represented by the symbol of FIG. 21A has the configuration shown in FIG. 21B if manufactured in the form of a CMOS semiconductor device. As shown in FIG. 21B, the CMOS type three-input NAND gate circuit includes the PMOSs P1, P2 and P3 and three NMOSs N1, N2 and N3. The PMOSs P1 to P3 are connected in parallel, between a high-potential power supply Vcc and an output terminal. The NMOSs N1 to N3 are connected in series between a ground terminal and the output terminal. In this gate circuit, the NMOSs N2 and N3 are susceptible to the influence of back-gate bias effect. In order to minimize the influence of the effect, a low impurity-concentration region 2a is provided below the gate electrode of the NMOS N2, and a low impurity-concentration region 2b is provided below the gate electrode of the NMOS N3, as is illustrated in FIG. 21C. The low impurity-concentration regions 2a and 2b mitigate the influence of the back-gate bias effect which the NMOSs N2 and N3 receive, as in the case of the two-input NAND gate circuit shown in FIGS. 20B and 20C.

The low impurity-concentration regions 2a and 2b may have the same impurity concentration. Nonetheless it is preferable that the region 2b has a lower impurity concentration than the region 2a. This is because the source potential of the NMOS N3 differs more from the back-gate bias potential than that of the NMOS N2, whereby the NMOS N3 is more influenced by the back-gate bias effect. To impart a lower impurity concentration to the region 2b than to the region 2a, it suffices to cover the NMOSs N2 and N3 with resist layers which have different widths.

FIG. 22A is a symbol for a two-input NOR gate circuit to which the invention is applied, FIG. 22B is a circuit diagram of the two-input NOR gate circuit, and FIG. 22C is a sectional view of the two-input NOR circuit.

The two-input NOR gate circuit represented by the symbol of FIG. 22A has the configuration shown in FIG. 22B if manufactured in the form of a CMOS semiconductor device. As shown in FIG. 22B, the CMOS type two-input NOR gate circuit includes two PMOSs P1 and P2 and two NMOSs N1 and N2. The PMOSs P1 and P2 are connected in series between a high-potential power supply Vcc and an output terminal. The NMOSs N1 and N2 are connected in parallel between a ground terminal and the output terminal. In this circuit, the PMOS P2 is susceptible to the influence of the back-gate bias effect. To reduce the influence of this effect, it is necessary to lower the impurity concentration of that part of the substrate 1 which is located below the gate electrode of the PMOS P2. The substrate 1 is of N type. In order to lower the impurity concentration of this part only, an N-type well region 50 is formed in the substrate 1 as illustrated in FIG. 22C, and ions of arsenic or phosphorus are implanted into that part of the well region 50 which is located below the gate electrode of the PMOS P2 by using a resist layer which covers the channel region of the PMOS P2. A low impurity-concentration region 50a is thereby formed below the gate electrode of the PMOS P2. Thus, the influence of the back-gate bias effect on the PMOS P2 is mitigated, as in the case of the CMOS type two-input NAND gate circuit shown in FIGS. 20B and 20C.

Figure 23A:
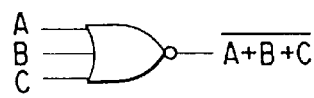
FIG. 23A is a symbol for a three-input NOR gate circuit to which this invention is applied.
Figure 23B:
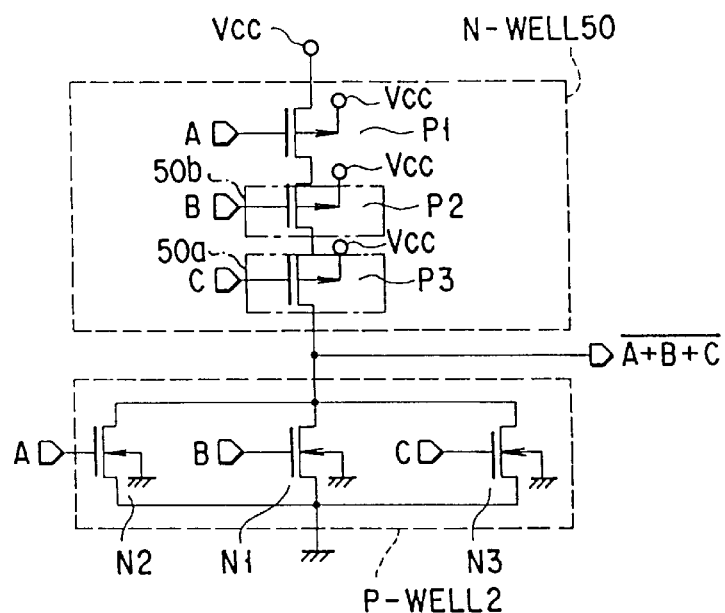
FIG. 23B is a circuit diagram showing the three-input NOR gate circuit.
Figure 23C:
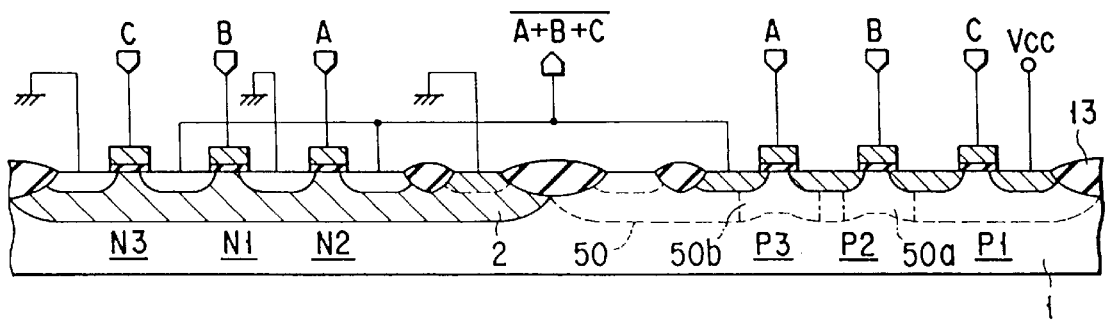
FIG. 23C is a sectional view of the three-input NOR circuit.

FIG. 23A is a symbol for a three-input NOR gate circuit to which this invention is applied, FIG. 23B is a circuit diagram of the gate circuit, and FIG. 23C is a sectional view thereof.

The three-input NOR gate circuit represented by the symbol of FIG. 23A has the configuration shown in FIG. 23B if made in the form of a CMOS semiconductor device. As shown in FIG. 23B, the three-input NOR gate circuit includes three PMOSs P1, P2 and P3 and three NMOSs N1, N2 and N3. The PMOSs P1 to P3 are connected in series between a high-potential power supply Vcc and an output terminal. The NMOSs N1 to N3 are connected in parallel between a ground terminal and the output terminal. In this gate circuit, the PMOSs P2 and P3 are susceptible to the back-gate bias effect. Therefore, as shown in FIG. 23C, low impurity-concentration regions 50a and 50b are formed in those portions of a well region 50 which are located below the gate electrodes of the PMOSs P2 and P3. These regions 50a and 50b mitigate the influence of the back-gate bias effect on the PMOSs P2 and P3, as in the three-input NAND gate shown in FIGS. 21B and 21C.

In the CMOS type two-input NOR gate circuit and the CMOS type three-input NOR gate circuit, both described above, the N-type substrate 1 and the N-type well region 50 may be replaced by a P-type substrate and a P-type well region, respectively.

Figure 24A:
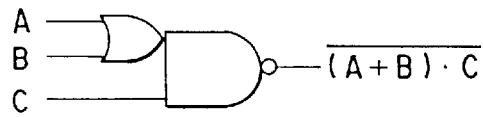
FIG. 24A is a symbol for an OR-NAND gate circuit to which the present invention is applied.
Figure 24B:
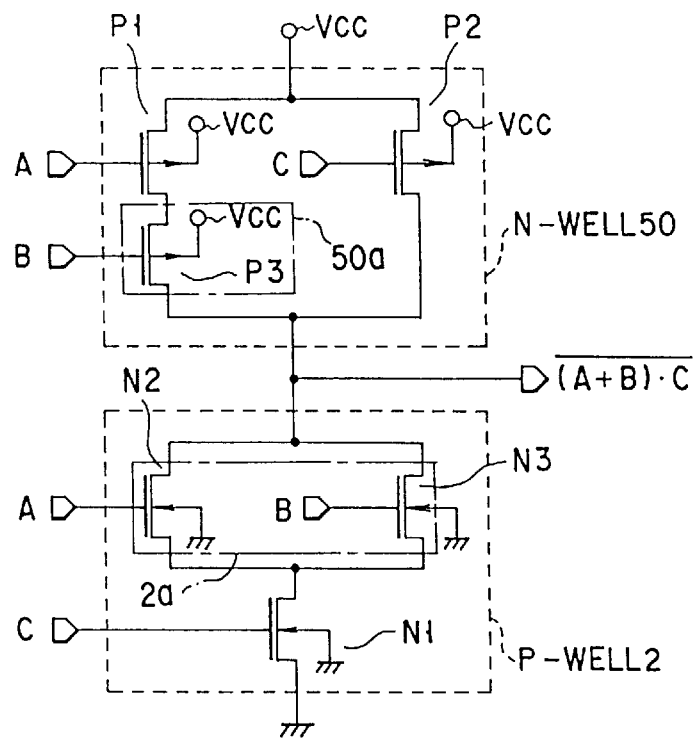
FIG. 24B is a circuit diagram showing the OR-NAND gate circuit.
Figure 24C:
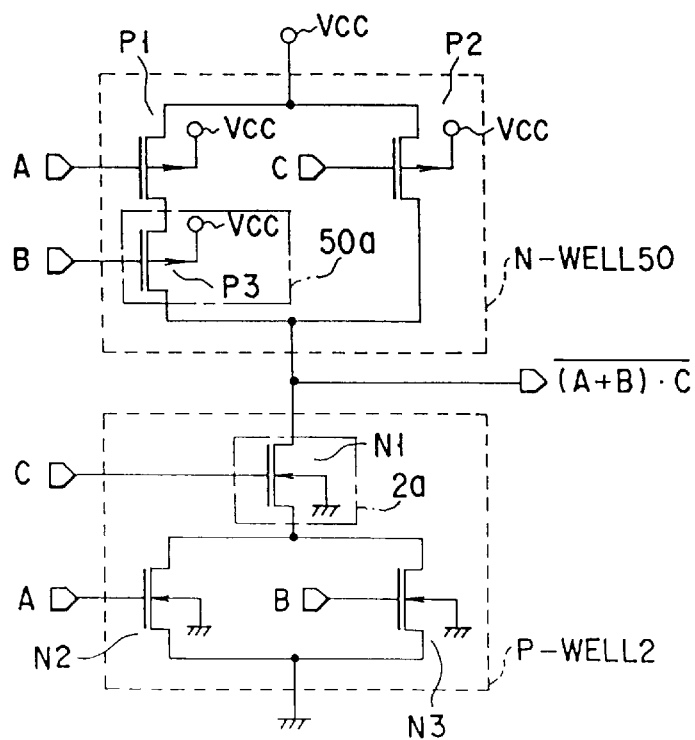
FIG. 24C is a circuit diagram of another OR-NAND gate circuit.

FIG. 24A is a symbol for an OR-NAND gate circuit to which the present invention is applied, and FIG. 24B is a circuit diagram showing this circuit. FIG. 24C is a circuit diagram of an OR-NAND gate circuit of a similar type.

The OR-NAND gate circuit represented by the symbol of FIG. 24A has either the configuration shown in FIG. 24B or the configuration shown in FIG. 24C, if manufactured in the form of a CMOS semiconductor device.

The CMOS type OR-NAND gate circuit of FIG. 24B, which has a typical configuration, will be described first. As shown in FIG. 24B, the circuit includes three PMOSs P1, P2 and P3 and three NMOSs N1, N2 and N3. The PMOSs P1 and P3 are connected in series between a high-potential power supply Vcc and an output terminal. The PMOS P2 is connected in parallel to the series circuit including the PMOSs P1 and P3. The NMOS N1 has its source connected to a ground potential. The NMOSs N2 and N3 are connected in parallel between the drain of the NMOS N1 and the output terminal. The PMOS P3, the NMOS N2 and NMOS N3 differ from one another in terms of source potential and back-gate bias potential.

FIG. 25A is a plan view of the CMOS type OR-NAND gate circuit shown in FIG. 24B, FIG. 25B is a sectional view taken along line 25B—25B in FIG. 25A, and FIG. 25C is a sectional view taken along line 25C—25C in FIG. 25A.

As shown in FIGS. 25A, 25B and 25C, those parts of a well region which are located below the gate electrodes of the PMOS P3, NMOS N2 and NMOS N3 are low impurity-concentration regions 50a, 2a and 2a, respectively. The influence of the back-gate bias effect on the PMOS P3 and the NMOSs N2 and N3 is thereby reduced.

Generally, it is desirable that two or more MOSFETs, if any, which are susceptible to the influence of the back-gate bias effect be aligned along their channel width and that their gates be located along the same straight line. In the OR-NAND gate circuit of FIG. 24B, the NMOSs N2 and N3 which are susceptible to the influence of the back-gate bias effect are aligned along their channel width, so that their gates may be located along a straight line as shown in the plan view of FIG. 25A. It follows that only one elongated resist layer suffices to cover the channel regions of both NMOSs N2 and N3. In other words, the resist layer need not have a complicated pattern. The use of a resist layer having a simple pattern is desirable to reduce the size of MOSFETs.

The CMOS type OR-NAND gate circuit of FIG. 24C will now be described. As can be clearly seen from FIG. 24C, this gate circuit differs from the gate circuit of FIG. 24B in that the position of the NMOS N1 and the positions of the NMOSs N2 and N3 are exchanged. More precisely, the NMOSs N2 and N3 have their sources connected to the ground terminal and their drains connected to the source of the NMOS N1, and the NMOS N1 has its drain connected to the output terminal. In the gate circuit of FIG. 24C, the PMOS P3 and the NMOS N1 are susceptible to the influence of the back-gate bias effect. In order to reduce the influence of this effect, two low impurity-concentration regions 50a and 2a are provided below the gate electrode of the PMOS P3 and that of the NMOS N1, as is illustrated in FIGS. 26A, 26B and 26C. The low impurity-concentration regions 50a and 2a mitigate the influence of the back-gate bias effect on the PMOS P3 and the NMOS N1. It should be noted that FIG. 26A is a plan view of the gate circuit shown in FIG. 24C, FIG. 26B is a sectional view taken along line 26B—26B in FIG. 26A, and FIG. 26C is a sectional view taken along line 26C—26C in FIG. 26A.

Figure 27A:
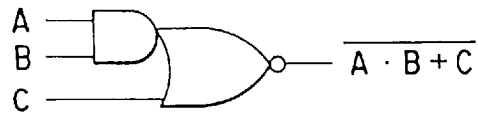
FIG. 27A is a symbol for an AND-NOR gate circuit to which the present invention is applied.
Figure 27B:
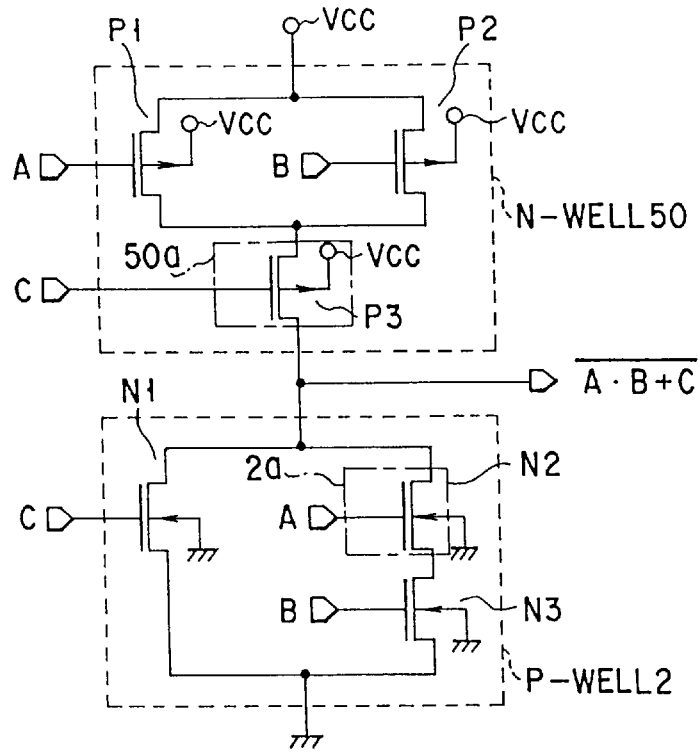
FIG. 27B is a circuit diagram showing the AND-NOR gate circuit.
Figure 27C:
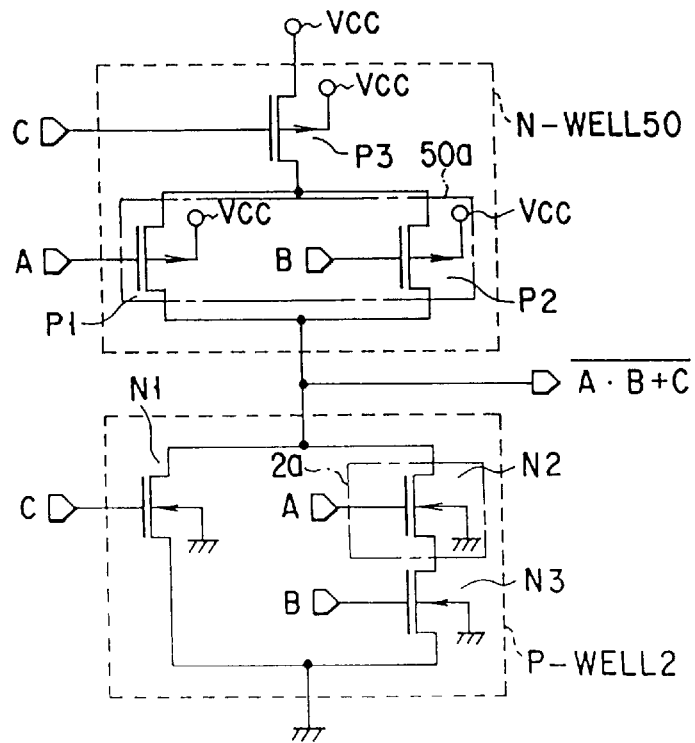
FIG. 27C is a circuit diagram of another AND-NOR gate circuit.

FIG. 27A is a symbol for an AND-NOR gate circuit to which the present invention is applied, and FIG. 27B is a circuit diagram of the AND-NOR gate circuit. FIG. 27C is a circuit diagram of an AND-NOR gate circuit of a similar type.

The AND-NOR gate circuit represented by the symbol of FIG. 27A has either the configuration shown in FIG. 27B or the configuration shown in FIG. 27C, if produced in the form of a CMOS semiconductor device.

The CMOS type AND-NOR gate circuit of FIG. 27B, which has a representative configuration, will be described first. As illustrated in FIG. 27B, this gate circuit includes three PMOSs P1, P2 and P3 and three NMOSs N1, N2 and N3. The PMOSs P1 and P2 have their sources connected to a high-potential power supply Vcc, and the PMOS P3 has its source connected to the drains of the PMOSs P1 and P2. The NMOSs N2 and N3 are connected in series between an output terminal and a ground terminal, and the NMOS N1 is connected in parallel to the NMOSs N2 and N3. In this gate circuit, the PMOS P3 and the NMOS N2 are susceptible to the influence of the back-gate bias effect since they differ in terms of source potential and back-gate bias potential.

Figure 28A:
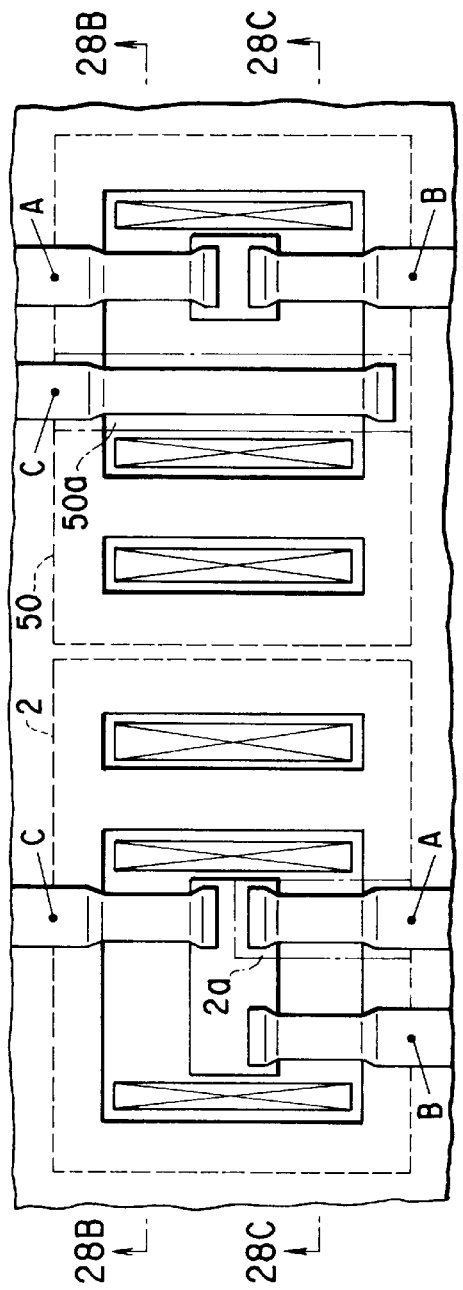
FIG. 28A is a plan view of the AND-NOR gate circuit shown in FIG. 27B.
Figure 28B:
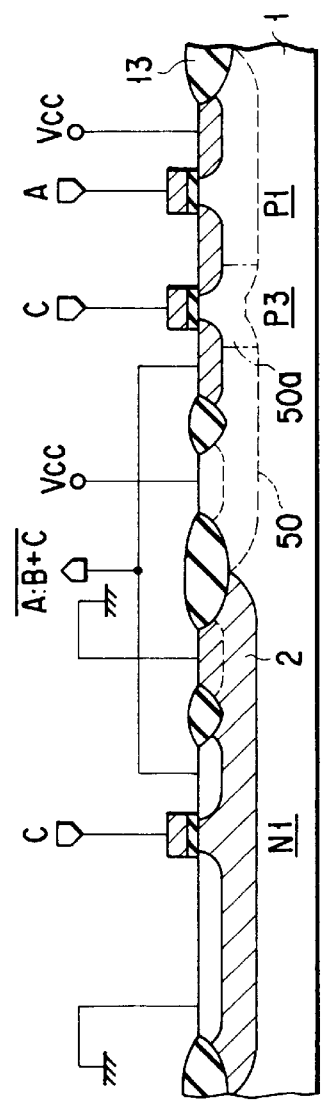
FIG. 28B is a sectional view taken along line 28B—28B in FIG. 28A.
Figure 28C:
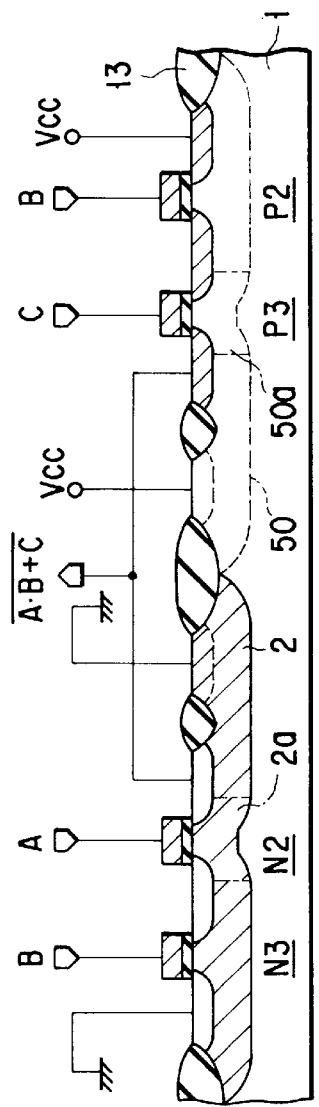
FIG. 28C is a sectional view taken along line 28C—28C in FIG. 28A.

FIG. 28A is a plan view of the CMOS type AND-NOR gate circuit shown in FIG. 27B, FIG. 28B is a sectional view taken along line 28B—28B in FIG. 28A, and FIG. 28C is a sectional view taken along line 28C—28C in FIG. 28A. As shown in FIGS. 28A to 28C, those parts of the well region 2 which are located below the gate electrodes of the PMOS P3 and the NMOS N2 are low impurity-concentration regions 50a and 2a. These regions 50a and 2a mitigate the influence of the back-gate bias effect on the PMOS P3 and the NMOS N2.

The CMOS type AND-NOR gate circuit of FIG. 27C will now be described. As can be clearly seen from FIG. 27C, the gate circuit differs from the gate circuit of FIG. 27B in that the position of the PMOS P3 and the positions of the PMOSs P1 and P2 are exchanged. More specifically, the PMOS P3 has its source connected to a power supply Vcc and its drain connected to the common source of the PMOSs P1 and P2. The common drain of the PMOSs P1 and P2 are connected to an output terminal. In the gate circuit of FIG. 27C, the PMOSs P1 and P2 and NMOS N2 are susceptible to the influence of the back-gate bias effect. Two low impurity-concentration regions 50a are provided below the gate electrodes of the PMOSs P1 and P2, and a low impurity-concentration region 2a is provided below the gate electrode of the NMOS N2, as is illustrated in FIGS. 29A, 29B and 29C. The low impurity-concentration regions 50a and 2a reduce the influence of the back-gate bias effect on the MOSFETs which constitute the AND-NOR gate circuit. It should be noted that FIG. 29A is a plan view of the gate circuit of FIG. 27C, FIG. 29B is a sectional view taken along line 29B—29B in FIG. 29A and FIG. 29C is a sectional view taken along line 29C—29C in FIG. 29A.

FIG. 30A is a symbol for a 2OR-NAND gate circuit to which this invention is applied, and FIG. 30B is a representative circuit diagram of the 2OR-NAND gate circuit.

The 2OR-NAND gate circuit represented by the symbol of FIG. 30A has the configuration shown in FIG. 30B if made in the form of a CMOS semiconductor device. As shown in FIG. 30B, the CMOS type 2OR-NAND gate circuit includes four PMOSs P1, P2, P3 and P4 and four NMOSs N1, N2, N3 and N4. The PMOSs P1 and P2 are connected in series between a high-potential power supply Vcc and an output terminal. The PMOSs P3 and P4 are connected in parallel to the PMOSs P1 and P2. The NMOSs N1 and N3 are connected in series between the output terminal and a ground terminal. The NMOSs N2 and N4 are connected in parallel to the NMOSs N1 and N3. This CMOS type gate circuit has the structure shown in FIGS. 31A to 31C if made as an integrated circuit in a silicon substrate. FIG. 31A is a plan view of the 2OR-NAND gate circuit shown in FIG. 30B, FIG. 31B is a sectional view taken along line 31B—31B in FIG. 31A, and FIG. 31C is a sectional view taken along line 31C—31C in FIG. 31A.

In the CMOS type 2OR-NAND gate circuit shown in FIG. 30B, the PMOSs P2 and P4 and the NMOSs N1 and N2 are susceptible to the influence of the back-gate bias effect. To minimize the influence of this effect, two low impurity-concentration regions 50a are provided below the gate electrodes of the PMOSs P2 and P4, respectively, and two low impurity-concentration regions 2a are provided below the gate electrodes of the NMOSs N1 and N2, respectively, as is illustrated in FIGS. 31A, 31B and 31C. The low impurity-concentration regions 50a and 2a mitigate the influence of the back-gate bias effect on the transistors which constitute the CMOS type 2OR-NAND gate circuit.

FIG. 32A is a symbol for a 2AND-NOR gate circuit to which the invention is applied.

The 2AND-NOR gate circuit represented by the symbol of FIG. 32A has the configuration shown in FIG. 32B if produced in the form of a CMOS circuit. As shown in FIG. 32B, the gate circuit includes four PMOSs P1, P2, P3 and P4 and four NMOSs N1, N2, N3 and N4. The PMOSs P1 and P3 are connected in series between a high-potential power supply Vcc and an output terminal. The PMOSs P2 and P4 are connected in parallel to the PMOSs P1 and P3. The NMOSs N1 and N2 are connected in series between the output terminal and a ground terminal. The NMOSs N3 and N4 are connected in parallel to the NMOSs N1 and N2. The CMOS type 2AND-NOR gate circuit has the structure shown in FIGS. 33A to 33C if made as an integrated circuit in a silicon substrate. FIG. 33A is a plan view of the 2AND-NOR gate circuit shown in FIG. 32B, FIG. 33B is a sectional view taken along line 33B—33B in FIG. 33A, and FIG. 33C is a sectional view taken along line 33C—33C in FIG. 33A.

In the gate circuit of FIG. 32B, the PMOSs P3 and P4 and the NMOSs N1 and N3 are susceptible to the influence of the back-gate bias effect. In order to reduce the influence of the effect, two low impurity-concentration regions 50a are provided below the gate electrodes of the PMOSs P3 and P4, respectively, and two low impurity-concentration regions 2a are provided below the gate electrodes of the NMOSs N1 and N3, respectively, as is shown in FIGS. 33A to 33C. The low impurity-concentration regions 50a and 2a mitigate the influence of the back-gate bias effect on the transistors which constitute the CMOS type 2AND-NOR gate circuit.

FIG. 34A is a symbol for a clocked inverter to which this invention is applied. The clocked inverter may assume either the configuration shown in FIG. 34B or the configuration shown in FIG. 34C, if made in the form of a CMOS type circuit.

The CMOS type clocked inverter of FIG. 34B, which is of a typical structure, will be described first. As shown in FIG. 34B, this inverter includes two PMOSs P1 and P2 and two NMOSs N1 and N2. The PMOSs P1 and P2 are connected in series between a high-potential power supply Vcc and an output terminal. The NMOSs N1 and N2 are connected in series between the output terminal and a ground terminal. Clock signals φ and $\bar{\phi}$ are supplied to the PMOS P2 and the NMOS N2, respectively, whose drains are connected to the output terminal.

The CMOS type clocked inverter of FIG. 34C will now be described. As can be understood from FIG. 34C, the inverter differs from the clocked inverter of FIG. 34B in that the PMOS P2 which receives the clock signal φ is connected to the high-potential power supply Vcc, and that the NMOS N2 which receives the clock signal $\bar{\phi}$ is connected to the ground terminal.

The CMOS type clocked inverter of FIG. 34B has the structure shown in the sectional view of FIG. 35 if made in the form of an integrated circuit, and the clocked inverter of FIG. 34C assumes the structure shown in the sectional view of FIG. 36, if each is produced in the form of an integrated circuit.

In the clocked inverter of FIG. 34B, the PMOS P2 and the NMOS N2 are susceptible to the influence of the back-gate bias effect. Thus, as shown in FIG. 35, a low impurity-concentration region 50a is provided below the gate electrode of the PMOS P2, and a low impurity-concentration region 2a is provided below the gate electrode of the NMOS N2. These regions 50a and 2a mitigate the influence of the back-gate bias effect on the transistors which constitute the CMOS type clocked inverter.

On the other hand, in the clocked inverter of FIG. 34C, the PMOS P1 and the NMOS N1 are susceptible to the influence of the back-gate bias effect. As shown in FIG. 36, a low impurity-concentration region 50a is provided below the gate electrode of the PMOS P1, and a low impurity-concentration region 2a is provided below the gate electrode of the NMOS N1. These regions 50a and 2a mitigate the influence of the back-gate bias effect on the transistors which constitute this CMOS type clocked inverter.

A DRAM to which the present invention will be described, with reference to FIG. 37 which is a circuit diagram showing a section of the DRAM. The DRAM differs from the shared sense amplifier incorporating the bit-line pair selecting gate which has been described with reference to FIGS. 19A and 19B.

Figure 37:
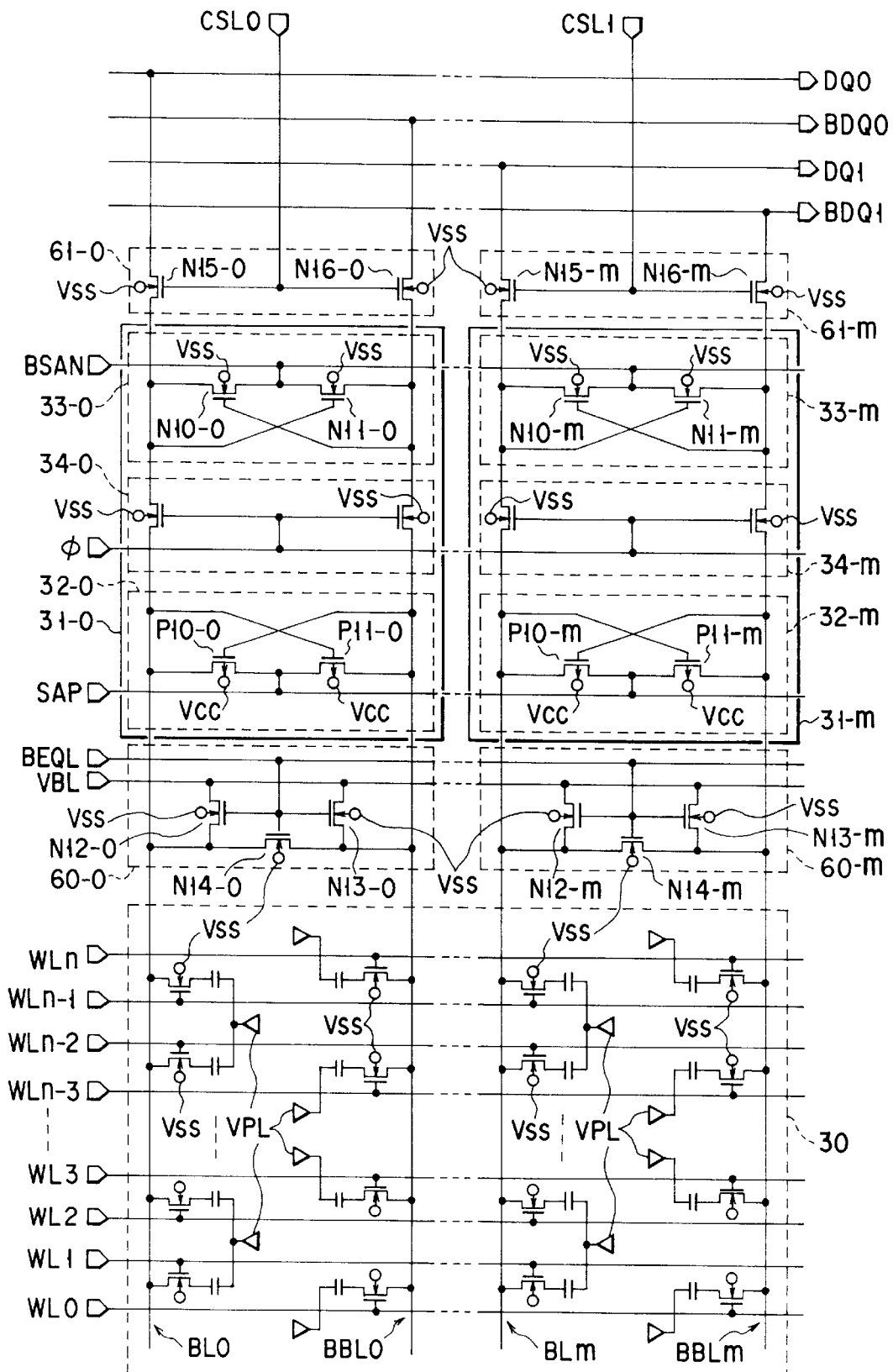
FIG. 37 is a circuit diagram showing a section of an DRAM to which the present invention is applied.

As shown in FIG. 37, the DRAM includes a plurality of sense circuits 31-0 to 31-m, each provided for one pair of bit lines BL and BBL. Each sense circuit includes two flip-flop circuits 32 and 33. The flip-flop circuit 32 includes two PMOSs, and the flip-flop circuit 33 includes two NMOSs.

A sense amplifier activating signal BSAN is supplied to the sources of the NMOSs constituting the flip-flop 33; a ground potential is not always applied to the sources of these NMOSs. The signal BSAN is normally set at a potential higher than the ground potential and is set at the ground potential only while the DRAM is undergoing sense operation.

Even in the circuit shown in FIG. 37, the sources of the transistors may sometimes be at a potential different from the substrate potential. Inevitably, the transistors are susceptible to the influence of the back-gate bias effect. To minimize the influence of this effect, an impurity is horizontally diffused into those parts of the well region which are located below the gate electrodes of the NMOSs of the flip-flop circuits 33-0 to 33-m. Low impurity-concentration regions are thereby provided below the gate electrodes of the NMOSs N10-0 to N10-m and N11-0 to N11-m which constitute the flip-flop circuits 33-0 to 33-m. These low impurity-concentration regions mitigate the influence of the back-gate bias effect on the NMOSs N10-0 to N10-m and NMOSs N11-0 to N11-m.

The power-supply potential Vcc is not always applied to the sources of the PMOSs P10-0 to P10-m and P11-0 to P11-m which constitute the flip-flop circuits 32-0 to 32-m, and a sense amplifier activating signal SAP is supplied to the sources of these PMOSs. The PMOSs are therefore susceptible to the influence of the back-gate bias effect. In order to decrease the influence of this effect, an impurity is horizontally diffused into those parts of the well region which are located below the gate electrodes of the PMOSs of the flip-flop circuits 32-0 to 32-m. Low impurity-concentration regions are thereby provided below the gate electrodes of the PMOSs P10-0 to P10-m and PMOSs P11-0 to P11-m which constitute the flip-flop circuits 32-0 to 32-m. These low impurity-concentration regions mitigate the influence of the back-gate bias effect on the PMOSs P10-0 to P10-m and PMOSs P11-0 to P11-m.

As shown in FIG. 37, the DRAM further includes a plurality of bit-line pair equalizing circuits 60-0 to 60-m, each provided for one pair of bit lines BL and BBL. Each of the circuits 60-0 to 60-m includes three NMOSs N12, N13 and N14. Applied to the NMOSs N12 and N13 are not the ground potential, but an equalizing potential VBL. Since the equalizing voltage VBL is, for example, 50 to 60% of the power-supply potential Vcc, the NMOSs N12 and N13 are susceptible to the influence of the back-gate bias effect. To reduce the influence of the effect, an impurity is horizontally diffused into those parts of the well region which are located below the gate electrodes of the NMOS N12-0 to N12-m and NMOS N13-0 to N13-m whose sources receive the equalizing potential VBL when an equalizing signal BEQL is supplied to their gates. Low impurity-concentration regions are thereby provided below the gate electrodes of the NMOS N12-0 to N12-m and NMOS N13-0 to N13-m. These low impurity-concentration regions mitigate the influence of the back-gate bias effect on the NMOSs N12-0 to N12-m and NMOSs N13-0 to N13-m.

The equalizing potential VBL is also supplied to the both ends of current path of NMOS N14 of each bit-line pair equalizing circuit, so that the NMOS N14 may short-circuit the two bit lines connected to the equalizing circuit. The NMOS N14 of each bit-line pair equalizing circuit is also susceptible to the influence of the back-gate bias effect. An impurity is horizontally diffused into those parts of the well region which are located below the gate electrodes of the NMOS N14-0 to N14-m. Low impurity-concentration regions are thereby provided below the gate electrodes of the NMOS N14-0 to N14-m. The low impurity-concentration regions, thus provided, mitigate the influence of the back-gate bias effect on the NMOSs P14-0 to P14-m.

As shown in FIG. 37, the DRAM further includes a plurality of column selecting gate circuits 61-0 to 61-m, each provided for a pair of bit lines BL and BBL. Each column selecting gate circuit includes two NMOSs N15 and N16. The NMOS N15 is provided on the bit line BL, whereas the NMOS N16 on the bit line BBL. Both NMOSs N15 and N16 are susceptive to the influence of the back-gate bias effect. Therefore, an impurity is horizontally diffused into those parts of the well region which are located below the gate electrodes of the NMOSs N15-0 to N15-m and NMOSs N16-0 to N16-m. Low impurity-concentration regions are thereby provided below the gate electrodes of the NMOSs N15-0 to N15-m and NMOSs N16-0 to N16-m. The low impurity-concentration regions, thus provided, mitigate the influence of the back-gate bias effect on the NMOSs N15-0 to N15-m and NMOSs N16-0 to N16-m.

Figure 38:
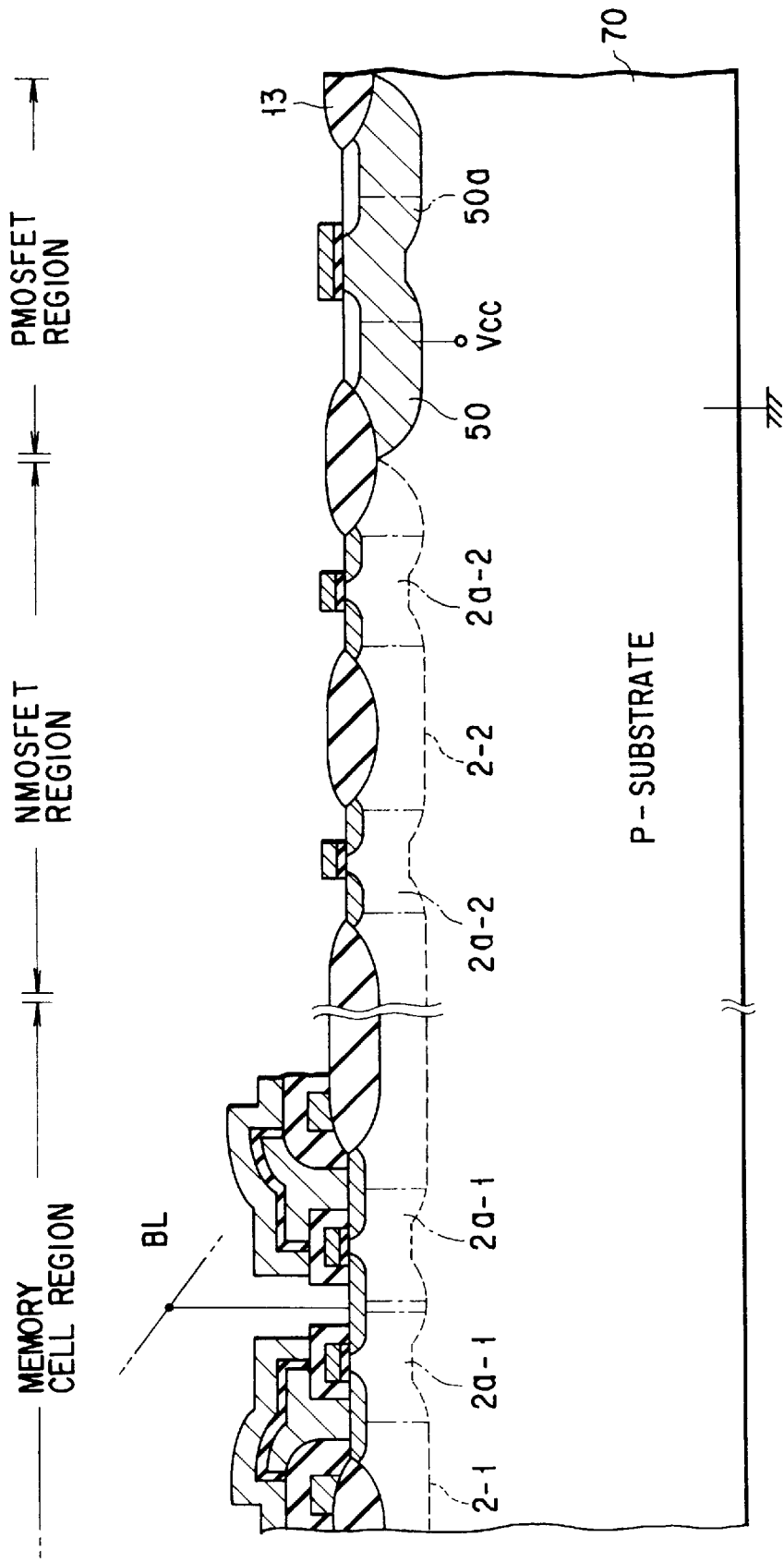
FIG. 38 is a sectional view of a stack-type DRAM.

The DRAM of FIG. 37 may be a stack-type DRAM which has the structure shown in FIG. 38.

As shown in FIG. 38, the stack-type DRAM includes a P-type silicon substrate 70, P-type well regions 2-1 and 2-2 provided in the upper surface of the substrate 70, and an N-type well region 50 provided in the upper surface of the substrate 1. The DRAM further includes stack-type memory cells provided in the P-type well region 2-1, NMOSs provided in the P-type well region 2-2 and PMOSs provided in the N-type well region 50. Provided in the P-type well region 2-2 is a low impurity-concentration region 2a-2 which has been formed by diffusing an impurity horizontally into the P-type well region 2-2. The channel regions of the NMOS N10, N11, ... N16 shown in FIG. 37 and the channel regions of other NMOSs are provided in the low impurity-concentration region 2a-2. A low impurity-concentration region 50a is provided in the N-type well region 50. The channel regions of the PMOSs P10 and P11 shown in FIG. 37 and the channel regions of other PMOSs are provided in the low impurity-concentration region 50a.

Furthermore, a low impurity-concentration region 2a-1 is provided in the P-type well region 2-1 wherein the stack-type memory cells have been formed. Provided in the low impurity-concentration region 2a-1 are the channel regions of the transfer transistors which are incorporated in the memory cells. In each memory cell, the transfer transistor has its source connected to the data-storing capacitor. Hence, the source potential of the transfer transistor is different from the substrate potential. The influence of the back-gate bias effect on the transfer transistor is reduced since the channel region of the transistor is provided in the low impurity-concentration region 2a-1. An increase in the threshold voltage of each transfer transistor, caused by the back-gate bias effect, is therefore mitigated. Each transfer transistor can have a sufficient current-driving ability even if its gate potential (i.e., the word-line potential) is lowered. This reduces the size reduction of the transfer transistor.

Since the transfer transistor is small and has yet an adequate current-driving ability despite its low gate potential, it can reliably transfer the charge in the data-storing capacitor to the bit line even if the capacitor has a small capacitance Cs because it is made smaller to increase the integration density of the DRAM. To state it another way, the transfer transistor has its sensitivity enhanced as much as the influence of the back-gate bias effect on it is mitigated. The higher the sensitivity of the transfer transistor, the more the capacitance Cs of the data-storing capacitor can be reduced, and the smaller the capacitor can be made.

The gate potential (i.e., word-line potential) of each transfer transistor needs to be lowered, for the following reason.

In the DRAM, to write data "1" into any memory cell of the DRAM, the power-supply potential is applied to the data-storing capacitor of the memory cell. The power-supply potential cannot be applied to the capacitor unless the bit line is set at the power-supply potential and unless the potential of the word line is raised to a value greater than the power-supply potential by the threshold voltage of the transfer transistor of the memory cell. Thus, when the data "1" is written into any memory cell, the source potential of the transfer transistor will become very high. The higher the source potential, the higher the back gate voltage and, hence, the threshold voltage. It is therefore required that the word line be set at a considerably high potential.

Since a plurality of memory cells are electrically connected to each word line, an extremely intense electric field will be applied on the gate oxide film of the transfer transistor of any memory cell if data "0" has been written into the memory cell by setting the bit line at 0V. An intense electric field applied on the gate oxide film of the transfer transistor is very likely to jeopardize the reliability of the memory cell. The easiest and most effective way to reduce the intensity of the electric field is to lower the word-line potential. In view of this, the DRAM shown in FIGS. 37 and 38 is advantageous since it is possible to lower the threshold voltage of each transfer transistor and the word-line potential for writing data "1" into each memory cell.

The present invention is effective when applied to a semiconductor device in which the bias potential of a P-type well region is not the ground potential. Among semiconductor devices of such a type is a DRAM with buried plate electrodes. This DRAM has a memory core section which includes memory cells and peripheral circuits and which is provided in P-type well regions formed in a semiconductor substrate. The P-type well regions are biased to a negative potential Vbb. If an NMOS is formed in any P-type well region biased to the negative potential Vbb, its source potential and its back-gate bias potential will differ from each other.

Figure 39:
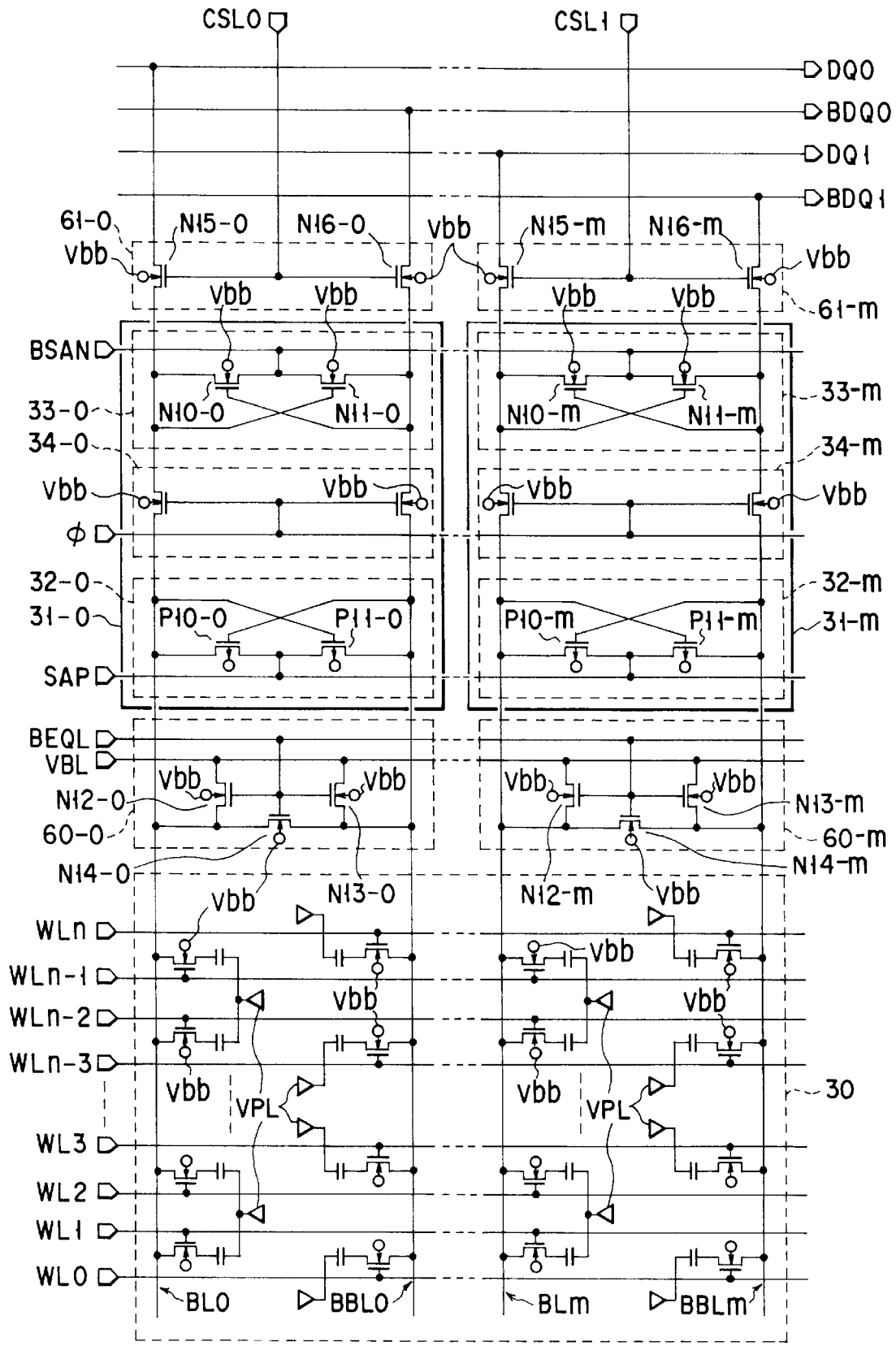
FIG. 39 is a circuit diagram showing a section of another DRAM to which the invention is applied.

FIG. 39 is a circuit diagram of a section of the DRAM with buried plate electrodes. As shown in FIG. 39, this DRAM is similar to the stack-type DRAM shown in FIG. 37, but differs in that NMOSs N10, N11, ... N16 have a substrate potential which is a negative potential Vbb.

FIG. 40 is a sectional view of the DRAM with buried plate electrodes. As shown in FIG. 40, the DRAM includes an N-type silicon substrate 1 and P-type well regions 71 and 72 provided in the upper surface of the substrate 1. The P-type well region 71 is biased to a negative potential Vbb, whereas the P-type well region 72 is biased to low-potential power supply Vss (e.g., the ground potential). The DRAM further includes P-type well regions 2-1 and 2-2 provided in the surface of the P-type well region 71, an N-type well region 50 provided in the surface of the P-type well region 72, and memory cells formed in the P-type well region 2-1. Each of the memory cells has a buried plate electrode.

The DRAM further includes NMOSs including NMOSs N10, N11, ... N16 (FIG. 39) and PMOSs including PMOSs P10 and P11 (FIG. 39). The NMOSs are provided in the P-type well region 2-2. The channel regions of the NMOSs are formed in low impurity-concentration regions 2a-2 provided in the P-type well region 2-2. The PMOSs are provided in the N-type well region 50. The channel regions of the PMOSs are formed in a low impurity-concentration region 50a provided in the N-type well region 50.

Furthermore, low impurity-concentration regions 2a-1 are provided in the the P-type well region 2-1 in which the memory cells with buried plate electrodes are formed. The low impurity-concentration regions 2a-1 have been formed by diffusing an impurity horizontally into some parts of the P-type well region 2-1. The channel regions of the transfer transistors of the memory cells with buried plate electrodes are provided in the low impurity-concentration regions 2a-1.

In the DRAM shown in FIGS. 39 and 40, it is possible to reduce the influence of the back-gate bias effect on the transistors incorporated in the peripheral circuits and also the influence of the effect on the transfer transistors of the memory cells. The transfer transistors have their sensitivity enhanced as much as the influence of the back-gate bias effect on them is decreased. As a result, data can be reliably read to the bit lines from the data-storing capacitors via the transfer transistors, as in the case of the stack-type DRAM shown in FIG. 38, even if the data-storing capacitors are small and have a small capacitance.

FIGS. 41A and 41B are perspective views explaining two of the steps of a method of manufacturing a semiconductor device to which the present invention is applied. FIG. 41C is a perspective view of the completed semiconductor device.

As shown in FIG. 41A, this device includes a well region 2 and a strip-shaped low impurity-concentration region 2a provided in the surface of the well region 2. The impurity concentration of the well region 2, particularly the surface impurity concentration, gradually decreases toward the axis B of the strip-shaped low impurity-concentration region 2a. Namely, the closer a part of the region 2 is to the axis B, the lower its impurity concentration.

As illustrated in FIG. 41B, the channel regions 6a, 6b and 6c of transistors are located out of mutual alignment along the axis B of the strip-shaped low impurity-concentration region 2a. Their channel regions so located, the transistors have different threshold voltages. Thus, transistors having different threshold voltages can be made by using only one low impurity-concentration region 2a.

Figure 42A:
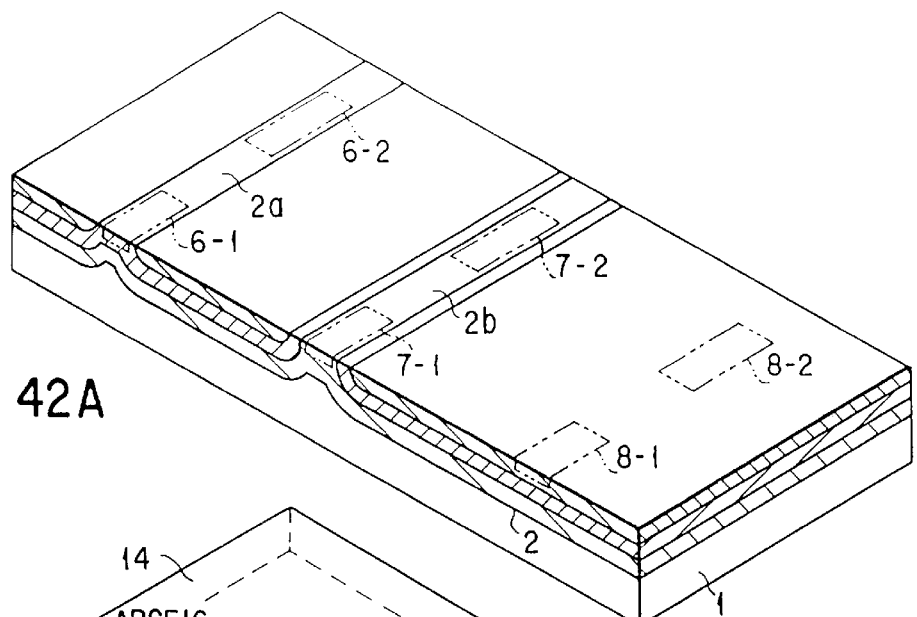
FIGS. 42A to 42C are perspective views explaining three steps of a method of manufacturing the semiconductor device to which the present invention applied.

According to this invention, channel ions may be implanted not into all channel regions, but into only selected channel regions, as will be described with reference to FIGS. 42A to 42C which are perspective views for explaining three of the steps of a method of manufacturing a semiconductor device according to the invention.

First, channel regions 6-1 and 6-2 are demarcated on a low impurity-concentration region 2a provided in the surface of a well region 2, and channel regions 7-1 and 7-2 are demarcated on a low impurity-concentration region 2b provided in the surface of the well region 2. Further, channel regions 8-1 and 8-2 are formed in the surface of the well region 2.

Figure 42B:
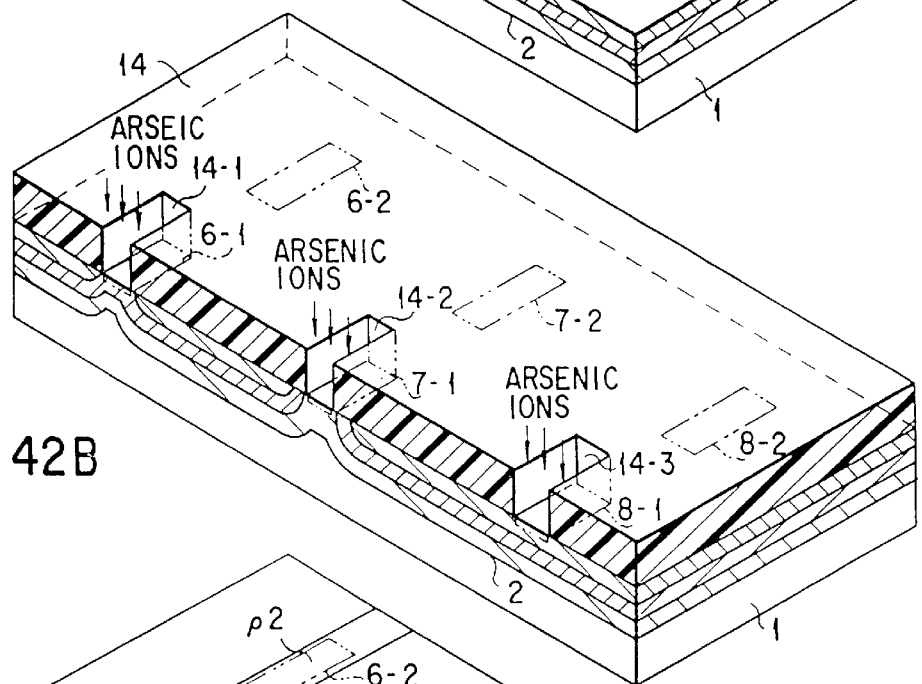
Figure 42C:
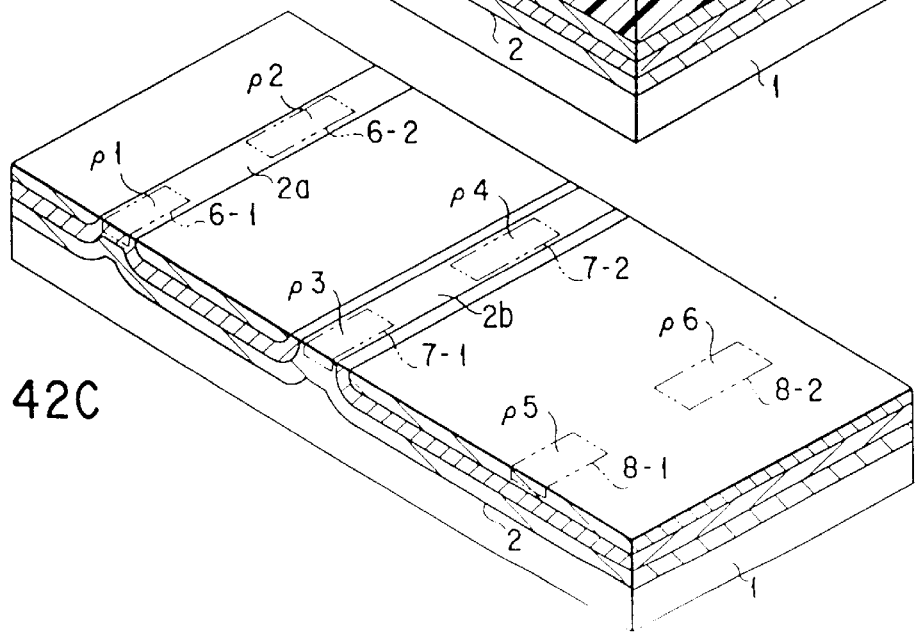

Next, as shown in FIG. 42B, a resist layer 14 is formed on the substrate 1, in preparation for implanting channel ions. The resist layer 14 has windows 14-1, 14-2 and 14-3. The windows are located so that the channel region 6-1 is exposed through the window 14-1, the channel region 7-1 through the window 14-2, and the channel region 8-1 through the window 14-3. The channel regions 6-2, 7-2 and 8-2 are covered with the resist layer 14. Using the resist layer 14 as a mask, channel ions are implanted into the selected channel regions 6-1, 7-1 and 8-1. Then, as shown in FIG. 42C, the resist layer 14 is removed from the surface of the substrate 1. As a result, the channel region 6-1 has an impurity concentration ρ1 different from the impurity concentration ρ2 of the channel region 6-2; the channel region 7-1 has an impurity concentration ρ3 different from the impurity concentration ρ4 of the channel region 7-2; and the channel region 8-1 has an impurity concentration ρ5 different from the impurity concentration ρ6 of the channel region 8-2.

Since channel ions are implanted into some of the channel regions provided in the well region 2, but not into the remaining channel regions, a plurality of channel regions having different impurity concentrations can be formed in a single well region (i.e., the region 2 in this instance). Hence, MOSFETs of different threshold voltages can be formed in a single substrate without increasing the number of manufacturing steps.

As has been described, the semiconductor devices according to the present invention have MOSFETs whose channel regions are formed in a well region. Those parts of the well region in which the channel regions are provided differ in near-surface impurity concentration. The MOSFETs therefore have different threshold voltages. Hence, the MOSFETs of different threshold voltages can be formed by using a relatively small number of masks. This helps to reduce the manufacturing cost of the devices and to elevate the yield of the devices. The semiconductor device according to the embodiments of the invention can therefore be inexpensive.

Moreover, the near-surface impurity concentration of any part of the well region in which the channel region of a MOSFET can be controlled by changing the width W of the resist layer used to form that well region. The threshold voltage of the MOSFET can thereby be adjusted to any desired value. Of the MOSFETs incorporated in the semiconductor device according to this invention, some may be made without implanting channel ions to the substrate.

According to the present invention, only selected parts of one well region are processed to have a low impurity concentration. With any semiconductor device of this invention there is no need to isolate well regions from one another as in a device which has two or more well regions having different impurity concentrations. It follows that contact holes need not be formed as is required in a device which has many well regions. The elements of the device according to the invention can therefore be made small.

In addition, the influence the back-gate bias effect imposes on the MOSFETs provided in the low impurity-concentration regions 2a and 2b can be mitigated. This advantage is more prominent for the MOSFETs which have relatively small channel widths Wch.

In the second embodiment of the invention, as indicated above, the narrower the channel of a MOSFET, the lower the impurity concentration of the region 2a in which the channel is provided. It is therefore possible to minimize the increase in the threshold voltage of the MOSFET which is caused by the back-gate bias effect.

In the fifth embodiment of the invention, the MOSFETs having channel regions provided in the low impurity-concentration regions 2a and 2b may be used as MOSFETs that cannot have broad channel widths because of the specific wiring pattern of the device. Even if these MOSFETs have narrow channel widths, their threshold voltages will increase only slightly.

In the fifth embodiment of the invention, the MOSFETs having channel regions provided in the low impurity-concentration regions 2a and 2b may be used as MOSFETs in which the source potential and the back-gate bias potential differ from each other because of the circuit configuration of the device. Also in this case, the increase in the threshold voltage of each MOSFET, caused by the back-gate bias effect, can be mitigated.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a well region of a first conductivity type formed in said semiconductor substrate, said well region including a first surface portion of the first conductivity type having a first surface impurity concentration and a second surface portion of the first conductivity type having a second surface impurity concentration, said first surface impurity concentration lower than the second surface impurity concentration;
    at least one insulated-gate field effect transistor including a channel region, a source region of a second conductivity type and a drain region of the second conductivity type, said channel region formed in said first surface portion of said well region, said source region and said drain region each formed in said second surface portion of said well region.

2. A semiconductor device according to claim 1, wherein an impurity concentration of said first portion increases toward said well region from said channel region along a lateral direction and decreases toward said semiconductor substrate from said channel region along a vertical direction.

3. A semiconductor device according to claim 1, wherein said source region is supplied with a potential different from a potential of said well region.

4. A semiconductor device according to claim 1, wherein at least one insulated-gate field effect transistor includes an N-channel insulated-gate field effect transistor incorporated in a gate circuit having a NAND logic function.

5. A semiconductor device according to claim 1, wherein at least one insulated-gate field effect transistor includes a P-channel insulated-gate field effect transistor incorporated in a gate circuit having a NOR logic function.

6. A semiconductor device according to claim 1, wherein at least one insulated-gate field effect transistor includes a P-channel insulated-gate field effect transistor incorporated in a gate circuit having an OR-NAND logic function.

7. A semiconductor device according to claim 1, wherein at least one insulated-gate field effect transistor includes a P-channel insulated-gate field effect transistor incorporated in a gate circuit having an AND-NOR logic function.

8. A semiconductor device according to claim 1, wherein at least one insulated-gate field effect transistor includes an insulated-gate field effect transistor incorporated in a clocked inverter.

9. A semiconductor device comprising:
    a semiconductor substrate;
    a well region of a first conductivity type formed in said semiconductor substrate, said well region including a first surface portion of the first conductivity type and a second surface portion of the first conductivity type, a junction between said well region and said semiconductor substrate being at a first depth below said first surface portion, the junction between said well region and said semiconductor substrate being at a second depth below said second surface portion, said first depth being shallower than said second depth; and
    at least one insulated-gate field effect transistor including a channel region, a source region of a second conductivity type and a drain region of the second conductivity type, said channel region formed in said first surface portion of said well region, said source region and said drain region each formed in said second surface portion of said well region.

10. A semiconductor device according to claim 9, wherein an impurity concentration of said first portion increases toward said well region from said channel region along a lateral direction and decreases toward said semiconductor substrate from said channel region along a vertical direction.

11. A semiconductor device according to claim 9, wherein said source region is supplied with a potential different from a potential of said well region.

12. A semiconductor device according to claim 9, wherein at least one insulated-gate field effect transistor includes an N-channel insulated-gate field effect transistor incorporated in a gate circuit having a NAND logic function.

13. A semiconductor device according to claim 9, wherein at least one insulated-gate field effect transistor includes a P-channel insulated-gate field effect transistor incorporated in a gate circuit having a NOR logic function.

14. A semiconductor device according to claim 9, wherein at least one insulated-gate field effect transistor includes a P-channel insulated-gate field effect transistor incorporated in a gate circuit having an OR-NAND logic function.

15. A semiconductor device according to claim 9, wherein at least one insulated-gate field effect transistor includes a P-channel insulated-gate field effect transistor incorporated in a gate circuit having an AND-NOR logic function.

16. A semiconductor device according to claim 9, wherein at least one insulated-gate field effect transistor includes an insulated-gate field effect transistor incorporated in a clocked inverter.

17. A semiconductor device comprising:
   a semiconductor substrate;
   a well region of a first conductivity type formed in said semiconductor substrate, said well region including a first surface portion of the first conductivity type having a first surface impurity concentration and a second surface portion of the first conductivity type having a second surface impurity concentration, said first surface impurity concentration being less than the second surface impurity concentration, a junction between said well region and said semiconductor substrate being at a first depth below said first surface portion, the junction between said well region and said semiconductor substrate being at a second depth below said second surface portion, said first depth being shallower than said second depth; and
   at least one insulated-gate field effect transistor including a channel region, a source region of a second conductivity type and a drain region of the second conductivity type, said channel region formed in said first surface portion of said well region, said source region and said drain region each formed in said second surface portion of said well region.

18. A semiconductor device according to claim 17, wherein an impurity concentration of said first portion increases toward said well region from said channel region along a lateral direction and decreases toward said semiconductor substrate from said channel region along a vertical direction.

19. A semiconductor device according to claim 17, wherein said source region is supplied with a potential different from a potential of said well region.

20. A semiconductor device according to claim 17, wherein at least one insulated-gate field effect transistor includes an N-channel insulated-gate field effect transistor incorporated in a gate circuit having an NAND logic function.

21. A semiconductor device according to claim 17, wherein at least one insulated-gate field effect transistor includes a P-channel insulated-gate field effect transistor incorporated in a gate circuit having a NOR logic function.

22. A semiconductor device according to claim 17, wherein at least one insulated-gate field effect transistor includes a P-channel insulated-gate field effect transistor incorporated in a gate circuit having an OR-NAND logic function.

23. A semiconductor device according to claim 17, wherein at least one insulated-gate field effect transistor includes a P-channel insulated-gate field effect transistor incorporated in a gate circuit having an AND-NOR logic function.

24. A semiconductor device according to claim 17, wherein at least one insulated-gate field effect transistor includes an insulated-gate field effect transistor incorporated in a clocked inverter.

* * * * *